United States Patent
Riho

(10) Patent No.: US 8,937,488 B2
(45) Date of Patent: Jan. 20, 2015

(54) CALIBRATION OF IMPEDANCE

(71) Applicant: PS4 Luxco S.a.r.l., Luxembourg (LU)

(72) Inventor: Yoshiro Riho, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/266,217

(22) Filed: Apr. 30, 2014

(65) Prior Publication Data

US 2014/0232429 A1    Aug. 21, 2014

Related U.S. Application Data

(63) Continuation of application No. 13/650,964, filed on Oct. 12, 2012, now Pat. No. 8,749,267.

(30) Foreign Application Priority Data

Oct. 17, 2011   (JP) ................................ 2011-228069

(51) Int. Cl.
  *H03K 17/16*   (2006.01)
  *H03K 19/00*   (2006.01)

(52) U.S. Cl.
  CPC .................................. *H03K 19/0005* (2013.01)
  USPC ............................................... 326/30; 326/21

(58) Field of Classification Search
  CPC ................. H03K 19/0005; H03K 19/017545; H03K 19/003
  USPC ......................................... 326/21, 30, 87, 83
  See application file for complete search history.

(56) References Cited

U.S. PATENT DOCUMENTS

| | | | | |
|---|---|---|---|---|
| 8,737,123 | B2* | 5/2014 | Ide | ................................ 365/174 |
| 8,760,902 | B2* | 6/2014 | Yokou | ............................. 365/63 |
| 2008/0122450 | A1 | 5/2008 | Yokou | |
| 2011/0026293 | A1 | 2/2011 | Riho | |
| 2011/0102073 | A1 | 5/2011 | Riho | |
| 2011/0193590 | A1 | 8/2011 | Nakagawa et al. | |
| 2012/0217992 | A1 | 8/2012 | Fujisawa | |

FOREIGN PATENT DOCUMENTS

| | | |
|---|---|---|
| JP | 2011-029535 A | 2/2011 |
| JP | 2011-101143 A | 5/2011 |

* cited by examiner

*Primary Examiner* — Don Le
(74) *Attorney, Agent, or Firm* — Foley & Lardner LLP

(57) ABSTRACT

A semiconductor device has a first controlled chip, including a first replica output circuit having the same configuration as a first output circuit, a first ZQ terminal connected to the first replica output circuit, a first through electrode connected to the first ZQ terminal, and a first control circuit which sets the impedance of the first replica output circuit. A control chip includes a second ZQ terminal connected to the first through electrode, a comparator circuit which compares a voltage of the second ZQ terminal with a reference voltage, and a second control circuit 123 which performs a process based on a comparison by the comparator circuit. The first control circuit and the second control circuit receive a common input signal to operate and sequentially change and set the impedance until the comparison result changes when an external resistance element is connected to the second ZQ terminal.

20 Claims, 14 Drawing Sheets

US 8,937,488 B2

CALIBRATION OF IMPEDANCE

CROSS REFERENCE TO RELATED APPLICATIONS

This application is a continuation of U.S. application Ser. No. 13/650,964, filed Oct. 12, 2012, which claims benefit of priority from the prior Japanese Application No. JP 2011-228069, filed Oct. 17, 2011; the entire contents of all of which are incorporated herein by reference.

BACKGROUND OF THE INVENTION

The present invention relates to a semiconductor device including a plurality of chips, and more particularly to a semiconductor device having a calibration circuit operable to adjust an impedance of an output circuit.

There has been known a calibration circuit connected to a ZQ terminal as one of external terminals of a semiconductor device. The calibration circuit adjusts the impedance of an output circuit connected to another external terminal, such as a DQ terminal, with use of an external resistance element connected to the ZQ terminal. For example, JP-A-2011-101143 discloses this type of circuit at FIG. 1.

There also has been known a semiconductor device having a plurality of semiconductor chips stacked together. The semiconductor chips are electrically connected to each other by through electrodes (through silicon vias; TSVs) extending through each of the semiconductor chips. For example, JP-A 2011-029535 discloses this type of semiconductor device at FIG. 4.

SUMMARY

In a semiconductor device including a plurality of semiconductor chips stacked together and electrically connected to each other by through electrodes, the distance between an extended terminal of the semiconductor device and each of the semiconductor chips (an internal wiring length including through electrodes) varies depending upon the stacked location of the semiconductor chip. Therefore, even if an external resistance element having a predetermined resistance value is connected to one of external terminals of the semiconductor device, it seems to each of the semiconductor chips that a resistance element having a different resistance value is connected to the semiconductor chip. Accordingly, if a calibration circuit of each of the semiconductor chips performs an impedance adjustment (calibration) on an output circuit of the semiconductor chip with use of the resistance element connected to the external terminal of the semiconductor device, then the obtained impedance is deviated from a proper value by an amount corresponding to its wiring length (the resistance value of the through electrodes). Specifically, each of the impedances of the semiconductor chips is not exactly matched with the resistance value of one external resistance element. Furthermore, the impedances of the semiconductor chips differ from each other.

Similarly, in a case of performing a calibration operation on each single one of semiconductor chips, then stacking those semiconductor chips together, and connecting those semiconductor chips to each other via through electrodes, the output impedances of the semiconductor chips as seen from the external terminal of the semiconductor device differ from each other.

Such variations in output impedance of the semiconductor chips inhibit a high-speed operation of the semiconductor device and also cause generation of a transmission error of a signal.

The present invention seeks to solve one or more of the above problems, or to improve upon those problems at least in part.

In one embodiment, there is provided a device that includes a first controlled chip and a control chip operable to control the first controlled chip. The first controlled chip is stacked on the control chip. The first controlled chip includes a first output circuit, a first replica output circuit having the same configuration as the first output circuit, a first ZQ terminal electrically connected to the first replica output circuit, a first through electrode connected to the first ZQ terminal and extending through the first controlled chip, and a first control circuit operable to set an impedance of the first replica output circuit. The control chip includes a second ZQ terminal connected to the first through electrode, a comparator circuit operable to compare a voltage of the second ZQ terminal with a reference voltage, a second control circuit operable to perform a process according to a comparison result from the comparator circuit, and a DQ input/output circuit operable to receive date from and transmit data to the first output circuit. The first control circuit and the second control circuit receive a common input signal to operate, adjust the impedance of the first replica output circuit according to the comparison result in a state in which an external resistance element is connected to the second ZQ terminal, and set the adjusted impedance to the first output circuit.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

A typical example of the technical concept of the present invention for solving problems in the prior art will be shown below. The present invention is not limited to the illustrated technical concept and should be defined by claims of the present application.

Figure 1:
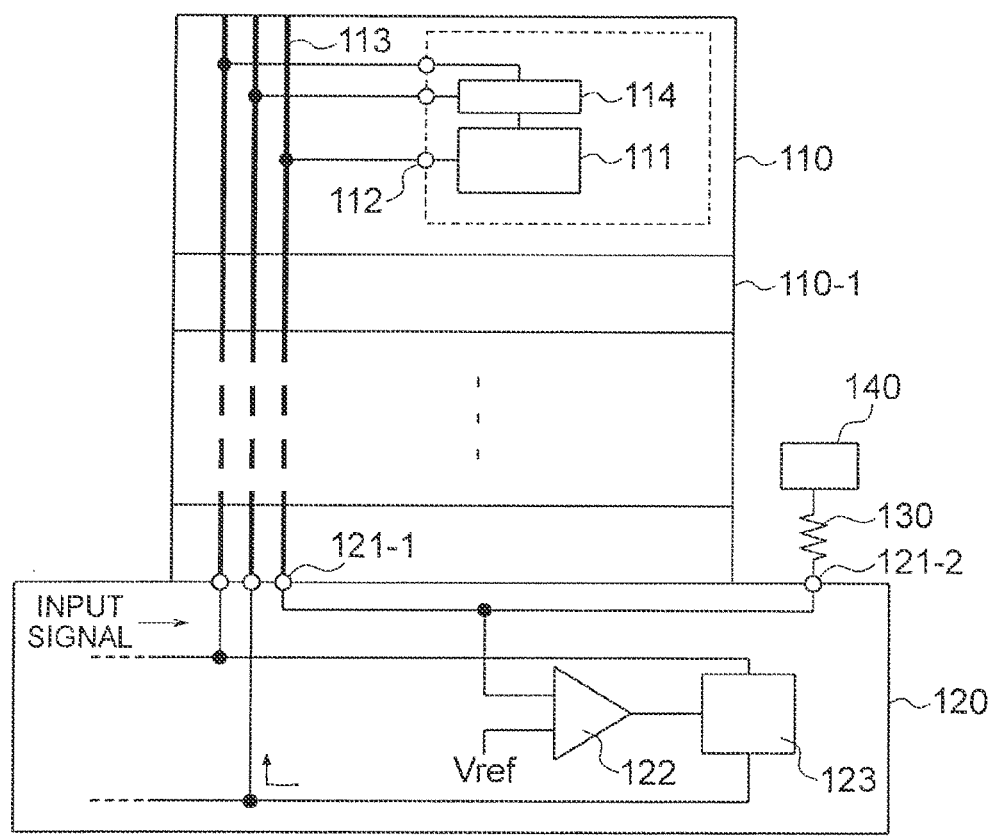
FIG. 1 is a block diagram showing an outlined configuration of a semiconductor device according to an example of the technical concept of the present invention.

FIG. 1 is a block diagram showing an outlined configuration of a semiconductor device 100 according to a typical example of the technical concept of the present invention.

In the semiconductor device 100, a comparator circuit 122 required for a calibration operation is separated from a first controlled chip 110 including a first replica output circuit 111 with respect to a second ZQ terminal 121-1 of a control chip 120, to which an external resistance element 130 is connected.

The semiconductor device 100 includes a first controlled chip 110, other controlled chips 110-1 and a control chip 120 on which the first controlled chip 110 is stacked along with the other controlled chips 110-1. Since the other controlled chips 110-1 have the same configuration as the first controlled chip 110, the order of stacking the controlled chips does not matter.

The first controlled chip 110 has a first output circuit (not shown) and a first replica output circuit 111 having the same configuration as the first output circuit. The first controlled chip 110 also has a first ZQ terminal 112 connected to the first replica output circuit 111, a first through electrode 113 connected to the first ZQ terminal 112, and a first control circuit 114 operable to set the impedance of the first replica output circuit 111. The first ZQ terminal 112 and the first through electrode 113 are formed so as to have the same electrical characteristics as a data terminal connected to the first output circuit and a through electrode connected to that data terminal.

The control chip 120 has a second ZQ terminal 121-1, a comparator circuit 122 connected to the second ZQ terminal 121-1, and a second control circuit 123. The second ZQ terminal 121-1 is connected to the first through electrode 113 of the first controlled chip 110 via other through electrodes formed in the other controlled chips 110-1. The comparator circuit 122 is operable to compare a voltage of the second ZQ terminal 121 with a reference voltage Vref. The second control circuit 123 is operable to perform a process according to comparison results from the comparator circuit 122. The control chip 120 also has an external terminal 121-2 connected to the second ZQ terminal 121-1. The external terminal 121-2 can be regarded as substantially the same node as the second ZQ terminal 121-1. This is because a parasitic resistance value of an internal wiring in the control chip 120 to which an input node of the comparator circuit 122 is connected is sufficiently smaller than a parasitic resistance value of the first through electrode 113. In the following description, therefore, those terminals may indistinctively be referred to as a second ZQ terminal 121.

The first control circuit 114 and the second control circuit 123 receive a common input signal to operate. The input signal may be generated within the control chip 120 or may be inputted from a higher-level device outside of the control chip 120. If the input signal provides instructions of a transition into a calibration mode, then the second control circuit 123 counts up with a counter until the comparison results of the comparator circuit 122 change. The count value of the counter is supplied to the first control circuit 114.

When the first control circuit 114 receives the instructions of a transition into a calibration mode, if sets the impedance of the replica output circuit 111 based upon the count value supplied from the second control circuit 123. Specifically, the first control circuit 114 sequentially changes the impedance of the replica output circuit 111 according to changes of the count value supplied from the second control circuit 123.

For a transition into a calibration mode, one end of an external resistance element 130 having a predetermined resistance value (e.g., 240Ω±1%) is connected to the second ZQ terminal 121. The other end of the external resistance element 130 is connected to a constant voltage source 140 operable to supply a predetermined voltage.

The comparator circuit 122 compares a voltage of the second ZQ terminal 121 with a reference voltage Vref and outputs a comparison result to the second control circuit 123. The second ZQ terminal 121 exhibits a voltage divided by the external resistance element 130, and the first replica output circuit 111 and the wiring. If an output voltage of the constant voltage source 140 and the reference voltage Vref are properly set, then the comparison result of the comparator circuit 122 changes on the threshold when a value obtained by adding a resistance value of the through electrodes to the impedance of the first replica output circuit 111 is equal to the resistance value of the external resistance element 130. The second control circuit 123 continues a counter operation until the comparison result of the comparator circuit 122 changes. When the comparison result of the comparator circuit 122 changes, the second control circuit 123 stops the counter operation and performs certain operations such as storing the count value in a register.

The count value stored in the register is transmitted to the first controlled chip 110 and used to set the impedance of the output circuit of the first controlled chip 110. Thus, the impedance of the output circuit is determined depending upon the external resistance element 130 and set to be a value that has considered a parasitic resistance of the through electrodes.

As described above, in the semiconductor device 100 of FIG. 1, the impedance of the output circuit in the first controlled chip 110 is adjusted (calibrated) with use of the comparator circuit 122 provided in the control chip 120. Thus, the output impedance of the first controlled chip 110 as seen from the control chip 120 includes a parasitic resistance of wiring including the through electrodes. In other words, the output impedance of the first controlled chip 110 as seen from the control chip 120 becomes constant irrespective of the stacked location of the first controlled chip 110 (wiring length to the control chip). This means that all of the controlled chips stacked on the control chip 120 have the same output impedance as seen from the control chip 120. FIG. 1 does not illustrate a DQ input/output circuit (214), to which the calibration results are actually applied. Such a DQ input/output circuit is disclosed in the drawings described later.

Preferred embodiments of the present invention will be described below in detail with reference to the accompanying drawings.

Figure 2:
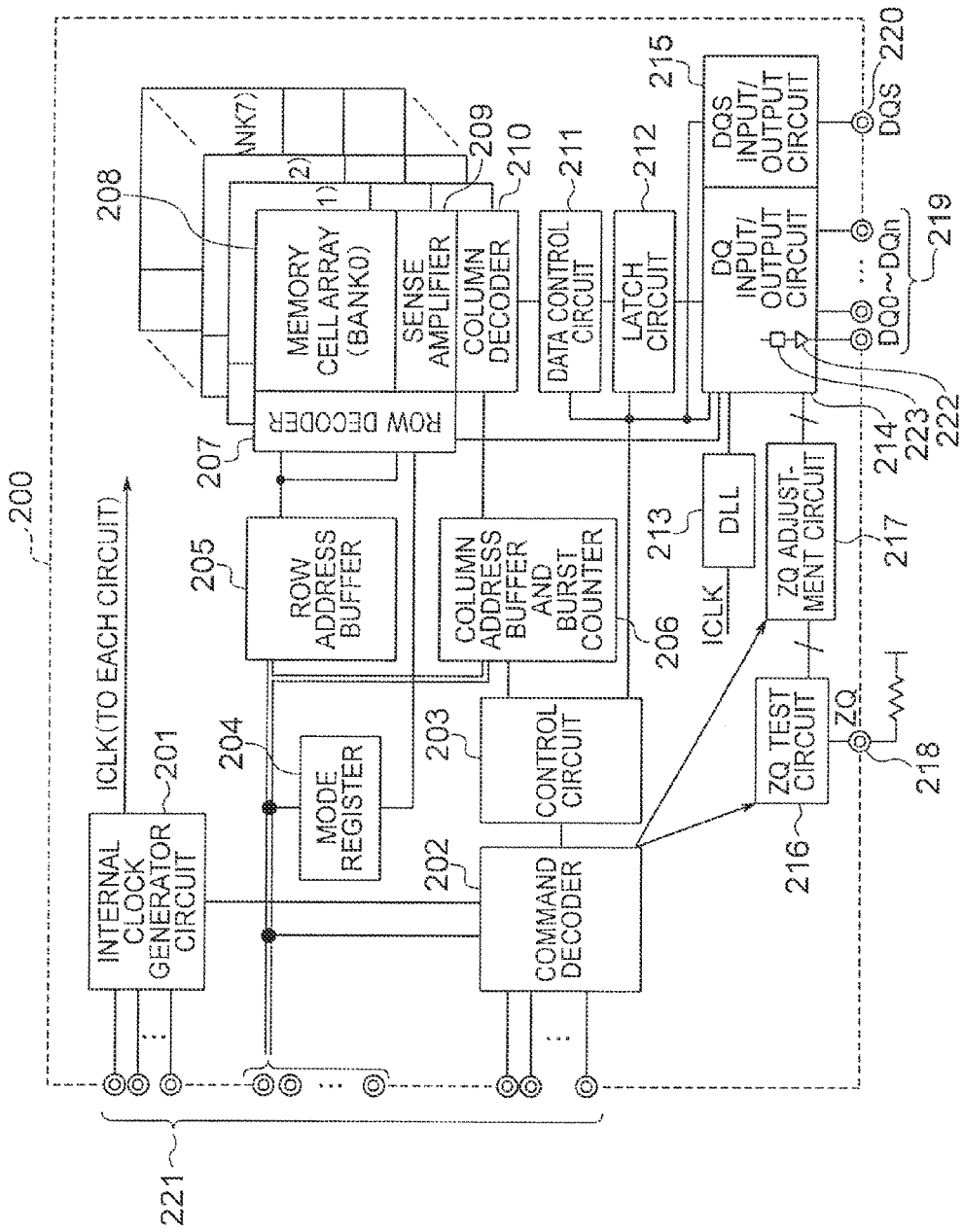
FIG. 2 is a block diagram showing an example of an internal configuration of a controlled chip used in a semiconductor device according to a first embodiment of the present invention.

FIG. 2 shows an example of a configuration of a semiconductor chip (controlled chip) 200 included in a semiconductor device according to a first embodiment of the present invention. The semiconductor chip 200 illustrated in FIG. 2 is a synchronous dynamic random access memory (SDRAM)

chip. Nevertheless, the present invention is not limited to an SDRAM chip and is applicable to various types of semiconductor chips.

The semiconductor chip 200 includes an internal clock generator circuit 201, a command decoder 202, a control circuit 203, a mode register 204, a row address buffer 205, a column address buffer and burst counter 206, a row decoder 207, a memory cell array 208, a sense amplifier 209, a column decoder 210, a data control circuit 211, a latch circuit 212, a delay locked loop (DLL) circuit 213, a data signal (DQ) input/output circuit 214, a data strobe signal (DQS) input/output circuit 215, a zero quotient (ZQ) test circuit 216, and a ZQ adjustment circuit 217. The ZQ test circuit 216 and the ZQ adjustment circuit 217 relate to the first replica output circuit 111 and the first control circuit 114, respectively.

The semiconductor chip 200 also includes a plurality of external terminals. The external terminals include a (first) ZQ terminal 218, DQ terminals 219, a DQS terminal 220, and control terminals 221 for receiving a clock signal, address signals, and command signals.

The ZQ test circuit 216 is connected to the ZQ terminal 218, which is one of the external terminals. The ZQ terminal 218 relates to the second ZQ terminal 121.

The data signal (DQ) input/output circuit 214 includes output circuits 222 connected to the external terminals (DQi) for outputting internal data from the chip and input circuits (not shown) connected to the external terminals (DQi) for inputting external data to the chip. The DQS input/output circuit 215 includes an output circuit and an input circuit in the same manner as the data signal (DQ) input/output circuit 214. Each of the output circuits 222 is connected to an impedance adjustment circuit 223 operable to adjust the impedance of the output circuit 222. Similarly, in the DQS input/output circuit 215, the output circuit is connected to an impedance adjustment circuit.

For example, each of the output circuits 222 is formed of a plurality of complementary metal oxide semiconductor (CMOS) inverters having drains connected in common to the external terminal (DQi). In a calibration operation, which will be described later, the impedance of a plurality of CMOS inverters is adjusted with use of a resistance element provided outside of the semiconductor device. The output circuit of the DQS input/output circuit 215 is formed in the same manner as the output circuits 222 of the data signal (DQ) input/output circuit 214. The impedance of the output circuit of the DQS input/output circuit 215 is adjusted in the same manner as the output circuits 222. The impedance of a group of P-channel metal oxide semiconductor (PMOS) transistors (pull-up side) of the CMOS inverters and the impedance of a group of N-channel metal oxide semiconductor (NMOS) transistors (pull-down side) are individually adjusted in a calibration operation. A pull-up replica circuit (indicated by 810 in FIG. 9) and a pull-down replica circuit (indicated by 820 in FIG. 9), which will be described later, correspond to the PMOS transistor group and the NMOS transistor group of the CMOS inverters, respectively. Specifically, the pull-up replica circuit (810) is formed in the same manner as the PMOS transistor group of the output circuit 222, and the pull-down replica circuit (820) is formed in the same manner as the NMOS transistor group of the output circuit 222.

The ZQ test circuit 216 is used when the DQ input/output circuit 214 and the DQS input/output circuit 215 are respectively calibrated. One DQS input/output circuit 215 and a plurality of DQ input/output circuits 214 are used as a set. If an impedance value of the output circuit of the DQS input/output circuit 215 does not match impedance values of the output circuits corresponding to the DQ input/output circuits 214, then a receiver in another semiconductor device to which data outputted from the DQ input/output circuits 214 are inputted cannot latch those data with accuracy.

Figure 3:
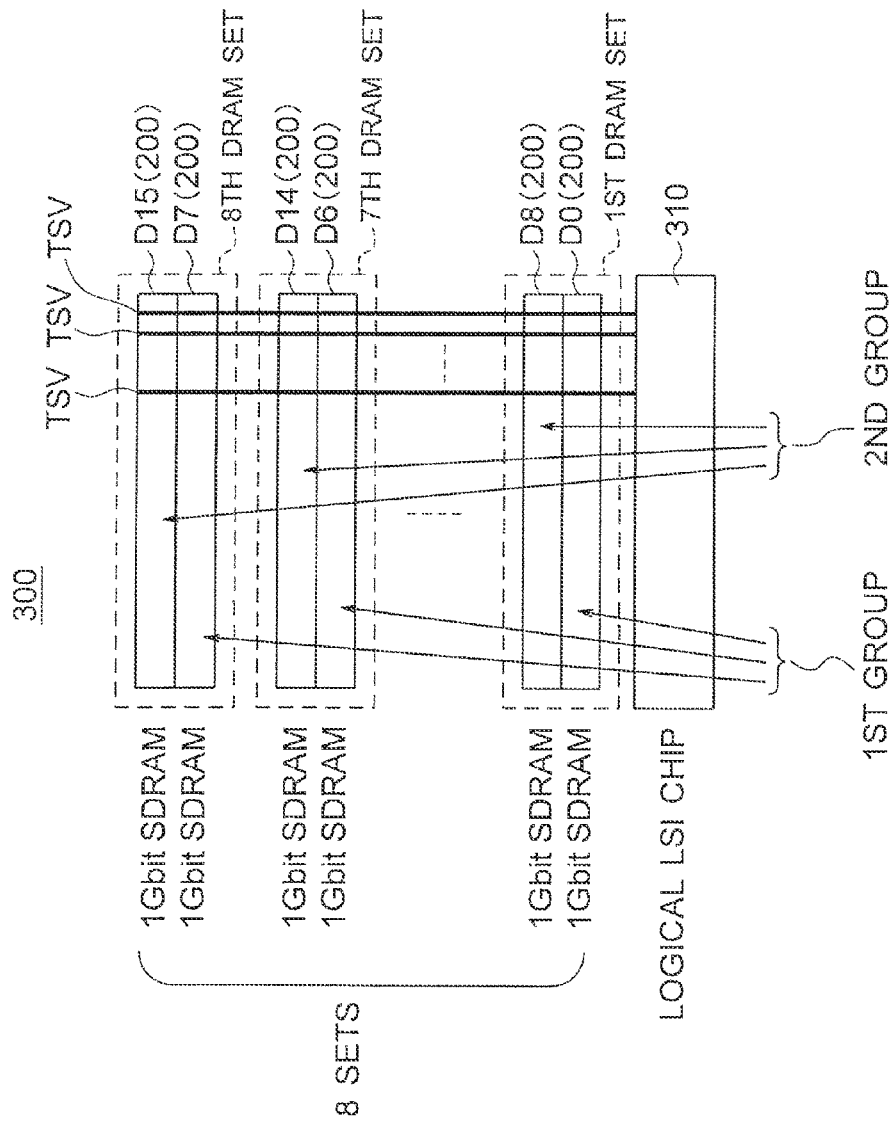
FIG. 3 is a diagram showing an outlined configuration of a semiconductor device according to the first embodiment of the present invention.

For example, a semiconductor device using the semiconductor chips 200 is formed as shown in FIG. 3.

Specifically, a semiconductor device 300 illustrated in FIG. 3 includes a logical LSI chip 310 and a plurality of semiconductor chips 200 stacked on the logical LSI chip 310. In this example, 16 semiconductor chips 200 (D0-D15) are stacked on the logical LSI chip 310. The logical LSI chip 310 is a control chip operable to control a plurality of semiconductor chips 200. Each of the semiconductor chips 200 is a controlled chip controlled by the logical LSI chip 310. A control chip is a master chip (active chip), and a controlled chip is a slave chip (passive chip). The semiconductor device 300 including a master chip and slave chips has a system-in-package structure in which those chips are stacked and assembled into one package.

The semiconductor device 300 shown in FIG. 3 has a structure incorporating chip-on-chip (COC) technology and through-silicon via (TSV) technology. External terminals (not shown) of the semiconductor device 300 shown in FIG. 3 are disposed on the logical LSI chip 310 (at a lower side in FIG. 3) via an interposer or the like. I/O signal lines formed by through electrodes (TSVs) extending through the controlled chips are connected to the logical LSI chip 310 and are not connected directly to the external terminals.

FIG. 3 illustrates an example in which 16 synchronous dynamic random access memory (SDRAM) chips D0-D15 with a memory capacity of 1 Gbit are stacked on the logical LSI chip 310 as a control chip.

The 16 SDRAM chips D0-D15 are grouped into a first group of the SDRAM chips D0-D7 and a second group of the SDRAM chips D8-D15. The first group and the second group are selected by a first clock signal CS0CK0 and a second clock signal CS1CK1 generated by the control chip (master chip). In the following description, the first and second groups may be referred to simply as "groups" or as "chip selection groups."

In the illustrated example, the SDRAM chip D0 and the SDRAM chip D8 form a first DRAM set disposed closest to the logical LSI chip 310. The SDRAM chips D1 and D9 form a second DRAM set. Similarly the SDRAM chip D6 and the SDRAM chip D14 form a seventh DRAM set, and the SDRAM chip D7 and the SDRAM chip D15 form an eighth DRAM set. As is apparent from FIG. 3, the SDRAM chip D15 of the eighth DRAM set is disposed farthest from the logical LSI chip 310. The first to eighth DRAM sets achieve a data transfer rate of 51.5 Gbytes/sec by accessing the control chip (master chip) in parallel to each other. In the following description, the first to eighth DRAM sets may be referred to as "sets" or "DRAM sets."

Each of the SDRAM chips D0-D15 has the same through electrode (through-silicon via; TSV) structure, or the same pin structure. Specifically, each of the SDRAM chips D0-D15 has 382 through electrodes TSV in total, which include 256 through electrodes for data signal (DQ) transmission, 32 through electrodes for data mask (DM), 64 through electrodes for data strobe signals DQS/DQSB, 14 through electrodes for addresses (A0-A13), 3 through electrodes for bank addresses (BA0-BA2), 3 through electrodes for command signals (/RAS(RASB), /CAS(CASB), /WE(WEB)), and 10 through electrodes for control signals (CS0, CS1, CKE0, CKE1, CK0, CK1, /CK0, /CK1, ODT0, ODT1). As a matter of course, through electrodes for a power supply are provided in addition to the aforementioned through electrodes. Signals such as a data signal (DQ), a data mask (DM), a data strobe signal DQS/DQSB, addresses (A0-A13), bank addresses (BA0-BA2), command signals (/RAS(RASB), /CAS(CASB), /WE (WEB)), and control signals (CS0, CS1, CKE0, CKE1, CK0, CK1, /CK0, /CK1, ODT0, ODT1) govern known DRAM functions. Signals CK0, CK1, /CK0, and /CK1 are system clocks used for communication between the control chip (master chip) and the controlled chips (slave chips). Those chips are synchronous chips.

The through electrodes TSV extending continuously through the SDRAM chips D0-D15 are referred to as continuous through electrodes.

Each of the illustrated SDRAM chips has an eight-bank configuration. Those SDRAM chips output 32-bit data signals in parallel. As described above, 256 through electrodes TSV for data signal (DQ) transmission are used in common by two groups (chip selection groups). In this case, each of the DDR3 SDRAM chips usually has a transfer rate of 1,600 Mbps. Therefore, each of the SDRAM chips can achieve a data transfer rate of 1,600 Mbps×32×8 DRAM sets=409.6 Gbit/sec=51.5 Gbytes/sec. The communication of the first group (first controlled chip) of the aforementioned two groups (chip selection groups) is controlled with a first access cycle by a first chip select signal outputted from the control chip. The communication of the second group (second controlled chip) of the aforementioned two groups (chip selection groups) is controlled with a second access cycle by a second chip select signal outputted from the control chip. The control chip controls the first and second groups in an exclusive manner to share the through electrodes corresponding to one I/O bit.

As indicated by solid lines in FIG. 3, each of the aforementioned continuous through electrodes TSV extends through all of the SDRAM chips from the SDRAM chip D15 to the SDRAM chip D0. Therefore, the continuous through electrodes TSV of the through electrodes for data signal (DQ) transmission and the through electrodes for data strobe signals DQS/DQSB have substantially the same length. Additionally the continuous through electrodes TSV of the through electrodes for addresses, commands, and clocks have substantially the same length.

Figure 4:
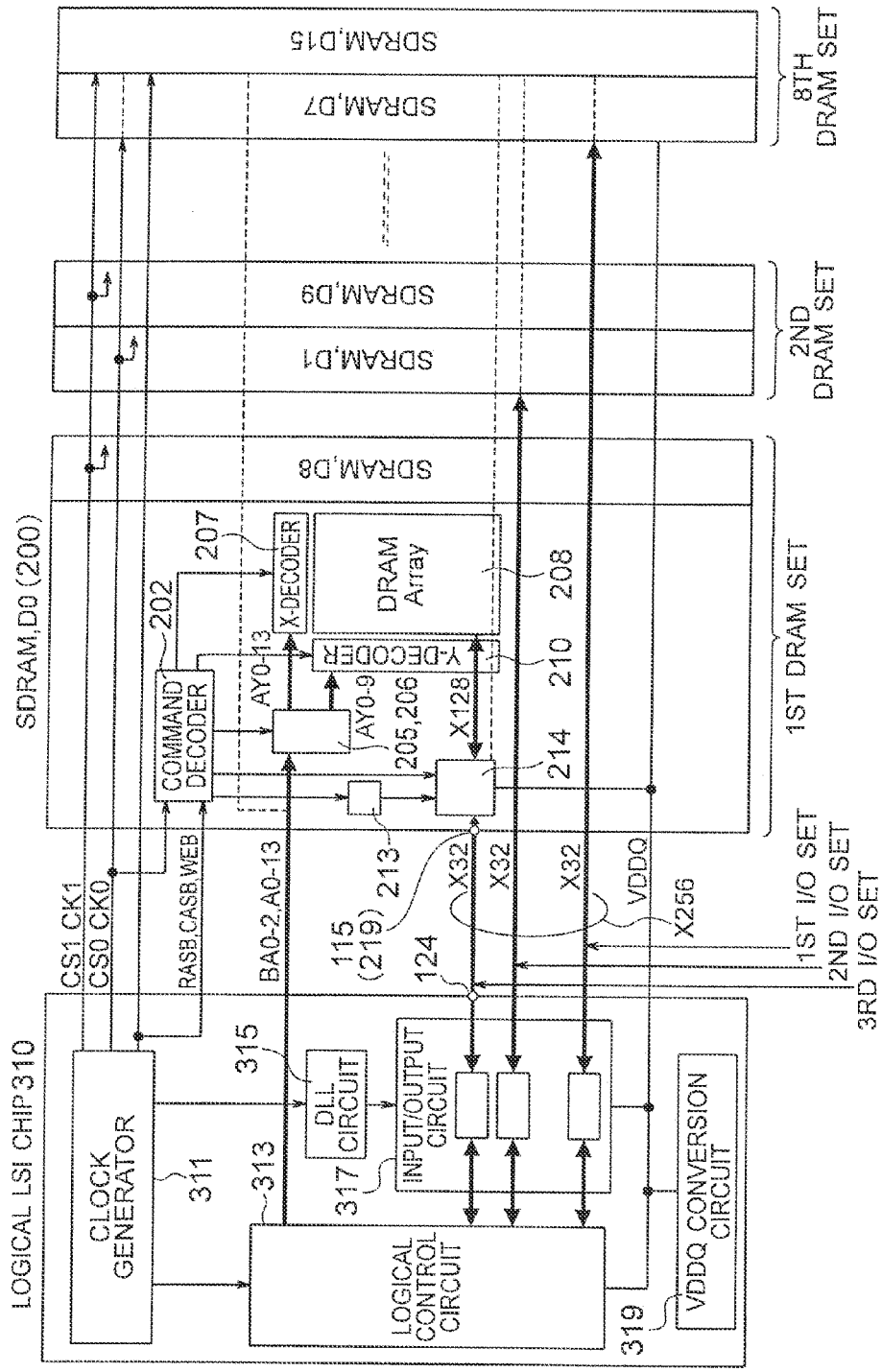
FIG. 4 is a block diagram showing an outlined internal configuration of a logical LSI chip and SDRAM chips in the semiconductor device of FIG. 3.

Referring to FIG. 4, the logical LSI chip 310 includes a clock generator 311, a logical control circuit (controller) 313, a delay locked loop (DLL) circuit 315, an input/output circuit 317, and a VDDQ (power source voltage) conversion circuit 319. The VDDQ conversion circuit 319 is operable to supply a main power source VDDQ for operating a memory not only to the input/output circuit 317 and the logical control circuit 313 of the logical LSI chip 310, but also to the SDRAM chips D0-D15 stacked on the logical LSI chip 310.

The illustrated clock generator 311 is operable to supply a first clock signal CS0CK0 to the SDRAM chips D0, D1, . . . , D7 shown in FIG. 2, which belong to the first controlled chip group, and also to supply a second clock signal CS1CK1 to the second group (chip selection group) of the SDRAM chips D8, D9, . . . , D15, which belong to the second controlled chip group. The clock generator 311 also has a function of outputting command signals RASB, CASB, and WEB. The signals RASB, CASB, and WEB indicate one command.

The first and second clock signals CS0CK0 and CS1CK1 are supplied to each of the SDRAM chips D0-D15 via the through electrodes TSV for clocks. The command signals are supplied to each of the SDRAM chips D0-D15 via the through electrodes TSV for commands. It is not necessary to supply the first clock signal CS0CK0 to the uppermost SDRAM chip D15, which belongs to the second group (chip selection group). In this embodiment, as indicated by a broken line, a through electrode TSV for the first clock signal CS0CK0 extends through the uppermost SDRAM chip D15. As a result, the through electrode TSV for the first clock signal CS0CK0 has substantially the same length as the through electrode TSV for the second clock signal CS1CK1. Specifically, the wiring of the through electrode for the first clock signal CS0CK0 includes a redundant wiring portion that is unnecessary to the essential connection, which is hereinafter referred to as an unnecessary redundant wiring.

The logical control circuit 313 provided in the logical LSI chip 310 serves as a controller operable to output a 3-bit bank address signal BA0-2 and a 14-bit address signal A0-13 and also to receive data signals DQ from and transmit data signals DQ to the input/output circuit 317. The logical control circuit 313 has a function similar to the function of a DDR controller of a stub series terminated logic (SSTL) type. The semiconductor chip of this embodiment differs from an SSTL type chip in that the logical LSI chip 310 having such a controller function is stacked along with the SDRAM chips D0-D15. Therefore, the logical LSI chip 310 has electrodes electrically connected to the continuous through electrodes provided in the SDRAM chips D0-D15.

The illustrated input/output circuit 317 is operable to receive 32-bit width data signals DQ from and transmit 32-bit width data signals DQ to the SDRAM chips D0-D15 and to receive and transmit the aforementioned 256-bit width parallel data signals DQ. The data signals DQ are I/O data signals. For example, with regard to the SDRAM chip D0, a data signal line for transmitting a data signal DQ interconnects a first data terminal 115 (indicated by 219 in FIG. 2) and a second data terminal 124 corresponding to the DQ input/output circuit 214 and the input/output circuit 317, respectively. This holds true for the other SDRAM chips. A first I/O group (×32 DQ signals) is assigned to the first DRAM set, and a second I/O group (=32 DQ signals) is assigned to the second DRAM set. Third to eighth I/O groups are respectively assigned to the third to eighth DRAM sets. Those eight I/O groups access the control chip (master chip) in parallel so that a data transfer rate of 51.5 Gbytes/sec is achieved as described above. Specifically a DRAM set defined by an I/O group determines a data transfer rate. In other words, a DRAM set defines the transfer band width, which indicates the number of I/O transfer bits simultaneously communicated. As the number of the DRAM sets increases, the transfer band width is widened so that the data transfer rate is increased. As the number of I/O bits of one I/O group increases, the transfer band width is widened so that the data transfer rate is increased. Meanwhile, the chip selection group determines the memory capacity. As the number of chip selection groups increases, the memory capacity is increased.

Figure 13:
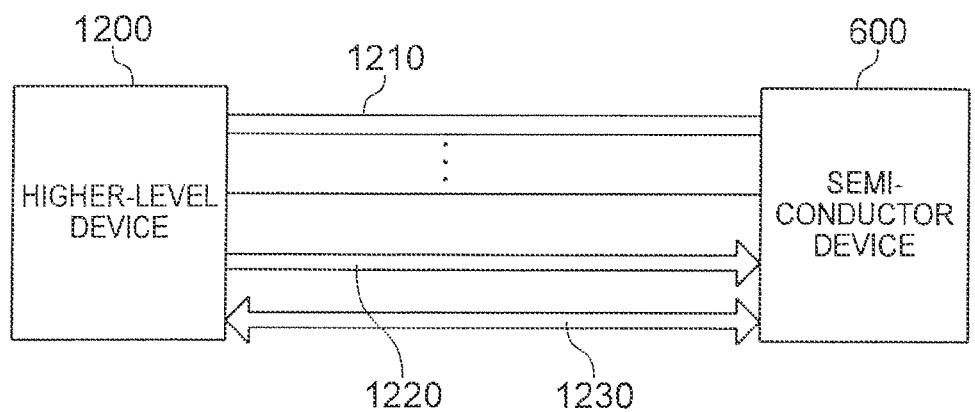
FIG. 13 is a block diagram showing an example of an information processing system using the semiconductor device of FIG. 6.
Figure 14:
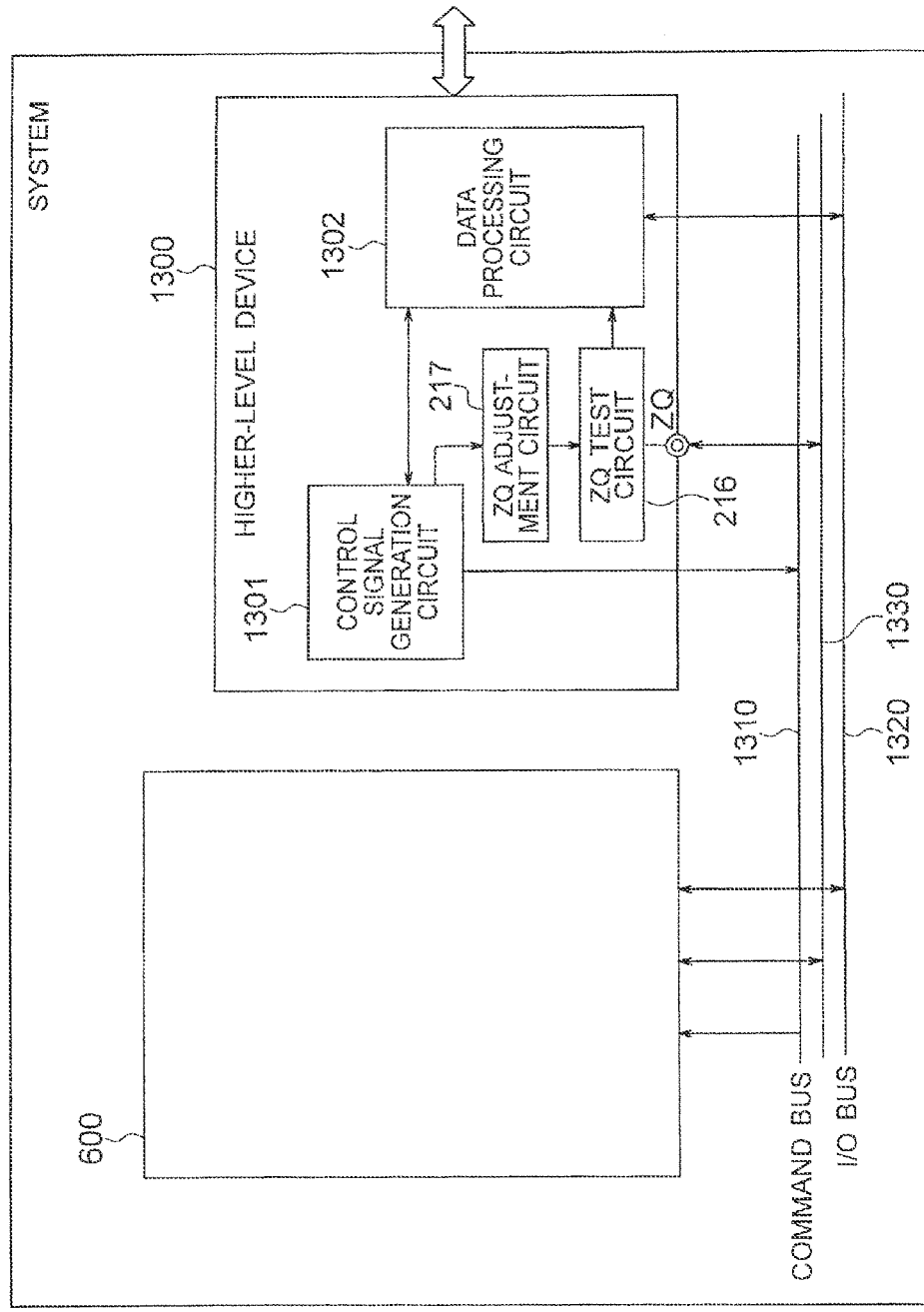
FIG. 14 is a block diagram showing another example of the information processing system using the semiconductor device of FIG. 6.

The logical LSI chip 310 has a plurality of external terminals of the semiconductor device 100 (see FIGS. 13 and 14). The DQ input/output circuit 214 may electrically be connected to an external device (e.g., a system as described later, a data bus 1230, or a data input/output (I/O) bus 1320) via the external terminals of the semiconductor device 100. The second data terminal 124 may electrically be connected to an external device (e.g., a system as described later, a data bus 1230, or a data input/output (I/O) bus 1320) via the external terminals of the semiconductor device 100.

In FIG. 3, therefore, it should be noted that the number of DRAM sets stacked on the logical LSI chip 310 (master chip) indicates the transfer band width, and that the number of chip selection groups in each of the DRAM sets indicates the memory capacity. The logical LSI chip 310 controls the controlled chips of each of the first and second sets (first and second DRAM sets) with the same access cycle so as to communicate information having a certain number of I/O band widths (258 data signals (DQ), or ×256 I/O) with the controlled chips.

The bank address signal BA0-2 and the 14-bit address signal A0-13 are supplied to all of the SDRAM chips D0-D15 via the through electrodes for addresses.

As is apparent from the foregoing description, the through electrodes TSV for the first and second clock signals, the through electrodes TSV for the command signals, and the through electrodes TSV for the address signals have substantially the same length.

The SDRAM chip D0 (first DRAM set) and the input/output circuit 317 of the logical LSI chip 310 are connected to each other by 32 through electrodes TSV for data signals DQ as indicated as ×32 (first I/O group). The input/output circuit 317 has interface circuits, such as buffers, corresponding to the SDRAM chips. Data signals DQ are transmitted between the logical control circuit 313 and the SDRAM chip D0 via the interface circuit. The interface circuit may include a parallel-serial converter circuit in some cases. The through electrodes TSV for data signals DQ between the SDRAM chip D0 and the logical LSI chip 310 extend not only through the SDRAM chip D0, but also through the SDRAM chips D8, D1, D9, and the like, and reach the uppermost SDRAM chip D15 so as to form a continuous through electrode. This means that the through electrode TSV for data signals DQ in the SDRAM chip D0 includes unnecessary redundant wirings from the SDRAM chip D1 (second DRAM set) to the SDRAM chip D15 (eighth DRAM set). The through electrodes TSV for data signals DQ in the SDRAM chip D0 is used in common by the SDRAM chip D8 (first DRAM set) as described later. In other words, the through electrodes TSV for data signals DQ in the SDRAM chip D0 is used in common by the first DRAM set, which includes the SDRAM chip D0 and the SDRAM chip D8. Specifically the logical LSI chip 310 and the SDRAM chip D0 are connected to each other by first through electrodes TSV for data signals DQ, and the SDRAM chip D0 and the SDRAM chip D8 are connected to each other by second through electrodes TSV for dote signals DQ that are electrically the same as the first through electrodes TSV for data signals DQ. The aforementioned unnecessary redundant wirings relating to the first DRAM set also extend to the other DRAM sets (second to eighth DRAM sets). However, the through electrodes TSV for data signals DQ (×32) used in the first DRAM set are redundant wiring portions that are unnecessary to the essential connection for second to eighth DRAM sets.

Similarly, through electrodes TSV for data signals DQ (second I/O group) in the SDRAM chip D1 (second DRAM set) extend from the input/output circuit 317 of the logical LSI chip 310 through the SDRAM chips D1 and D0 to the SDRAM chip D15. It can be seen that the through electrodes TSV for data signals DQ in the SDRAM chip D1 also include unnecessary redundant wirings from the second DRAM set to the eighth DRAM set. Similarly, through electrodes TSV for data signals DQ in the SDRAM chip D7 are provided between the input/output circuit 317 of the logical LSI chip 310 and the SDRAM chip D7. Through electrodes TSV for data signals DQ in the SDRAM chip D7 are also formed of 32 through electrodes and used in common by the SDRAM chip D15. Thus, each of the through electrodes TSV for data signals DQ constitutes a continuous through electrode connecting between the logical LSI chip 310 and the uppermost SDRAM chip D15. Those through electrodes TSV for data signals DQ have substantially the same length.

A configuration of an SDRAM chip used in this embodiment will be described along with an example of the SDRAM chip D0. In addition to the aforementioned through electrodes, the SDRAM chip D0 has a memory cell (DRAM) array 208 having a memory capacity of 2 Gbits, a command decoder 202, address buffers 205 and 206, a row (X) decoder 207, a column (Y) decoder 210, a DLL circuit 213, and a DQ input/output circuit 214 as described with reference to FIG. 1.

The command decoder 202 of the SDRAM chip D0, which belongs to the first group (chip selection group), is operable to decode command signals RASB, CASB, and WEB supplied from the logical LSI chip 310.

Meanwhile, the bank address signal BA0-2 and the address signal A0-A13 are supplied from the logical control circuit 313 to the address buffers 205 and 206. The address buffers 205 and 206 output address signals AX0-13 and AY0-9 to the X-decoder 207 and the Y-decoder 210, respectively. When the address signals AX0-13 and AY0-9 are supplied to the X-decoder 207 and the Y-decoder 210, the illustrated DRAM array 208 performs parallel input and output of 128-bit data signals (i.e., ×128) to the DQ input/output circuit 214. The input/output operation of the 128-bit data signals is performed under the control of a command from the command decoder 202 and a clock from the DLL circuit 213.

The DQ input/output circuit 214 is operable to receive ×128-bit parallel data signals from and transmit ×128-bit parallel data signals to the DRAM array 203 and also to receive 32-bit parallel data signals (×32) from and transmit 32-bit parallel data signals (×32) to the logical LSI chip 310. Specifically the DQ input/output circuit 214 has a function of converting ×128-bit data signals into ×32-bit data signals and converting ×32-bit data signals into ×128-bit data signals.

With the illustrated configuration, the lengths of through electrodes TSV for data signals DQ and data strobe signals DQS/B can be made substantially the same in all of a plurality of DRAM sets corresponding to a plurality of I/O groups. Therefore, the skew between the data signals DQ and the data strobe signals DQS/B can be minimized. This configuration (equal-length wiring) is very important to a structure in which a plurality of DRAM sets are stacked on a controller chip. This is because the controller chip can highly accurately control the communication of DQ signals (×256 DQ signals) for a plurality of I/O groups, each of which includes ×32 DQ signals, with one synchronous signal. Since the lengths of the through electrodes TSV for addresses, commands, and clock signals can also be made substantially the same, the skew between the address signals and the clock signals and the skew between the command signals and the dock signals can be minimized.

As described above, in the first embodiment of the present invention, there is provided a semiconductor device in which a control chip (the logical LSI chip 310 in FIGS. 3 and 4) and a plurality of controlled chips (the SDRAM chips D1-D15 in FIGS. 3 and 4) are stacked with use of TSV technology.

Now it is assumed that two controlled chips are stacked on one control chip and are connected to the control chip via through electrodes.

For example, a first chip is defined as a control chip (master chip), and a second chip (first DRAM set) and a third chip (second DRAM set) are defined as controlled chips (slave chips). The second and third chips are sequentially stacked on the first chip. In such a case, communication (reading/writing) of each I/O group is conducted between the first control chip and the second and third controlled chip. At that time, the length of a signal line connecting between circuits of the first control chip and the second controlled chip (first impedance) differs from the length of a signal line connecting between circuits of the first control chip and the third controlled chip (second impedance), resulting in varied time of signal arrival and a varied amount of reflected waves (with respect to each of the chips).

In consideration of the above, according to the first embodiment the length of the signal line between the first chip (control chip) and the second chip (controlled chip) is made equal to the length of the signal line between the first chip (control chip) and the third chip (controlled chip). Accordingly, the first impedance and the second impedance can be made substantially equal to each other.

Practically, it is preferable to consider a situation in which signal lines formed by through electrodes may have different impedances because of manufacturing variations in a manufacturing process (a TSV formation process, a bump formation process, and a connection process of TSVs and bumps). In other words, through electrodes produced by different manufacturing processes may have different impedances.

It is also preferable to expect that the impedance of signal lines may vary because of inherent manufacturing variations if a plurality of signal lines are formed of a plurality of through electrodes.

It is preferable to consider cases where on-die termination (ODT) in which a terminating resistor is connected onto each of SDRAM chips should be adjusted individually depending upon the aforementioned manufacturing variations.

A calibration operation performed in a related semiconductor device will be described below prior to explanation of the ZQ test circuit 216, which relates to the present invention in particular.

Figure 5:
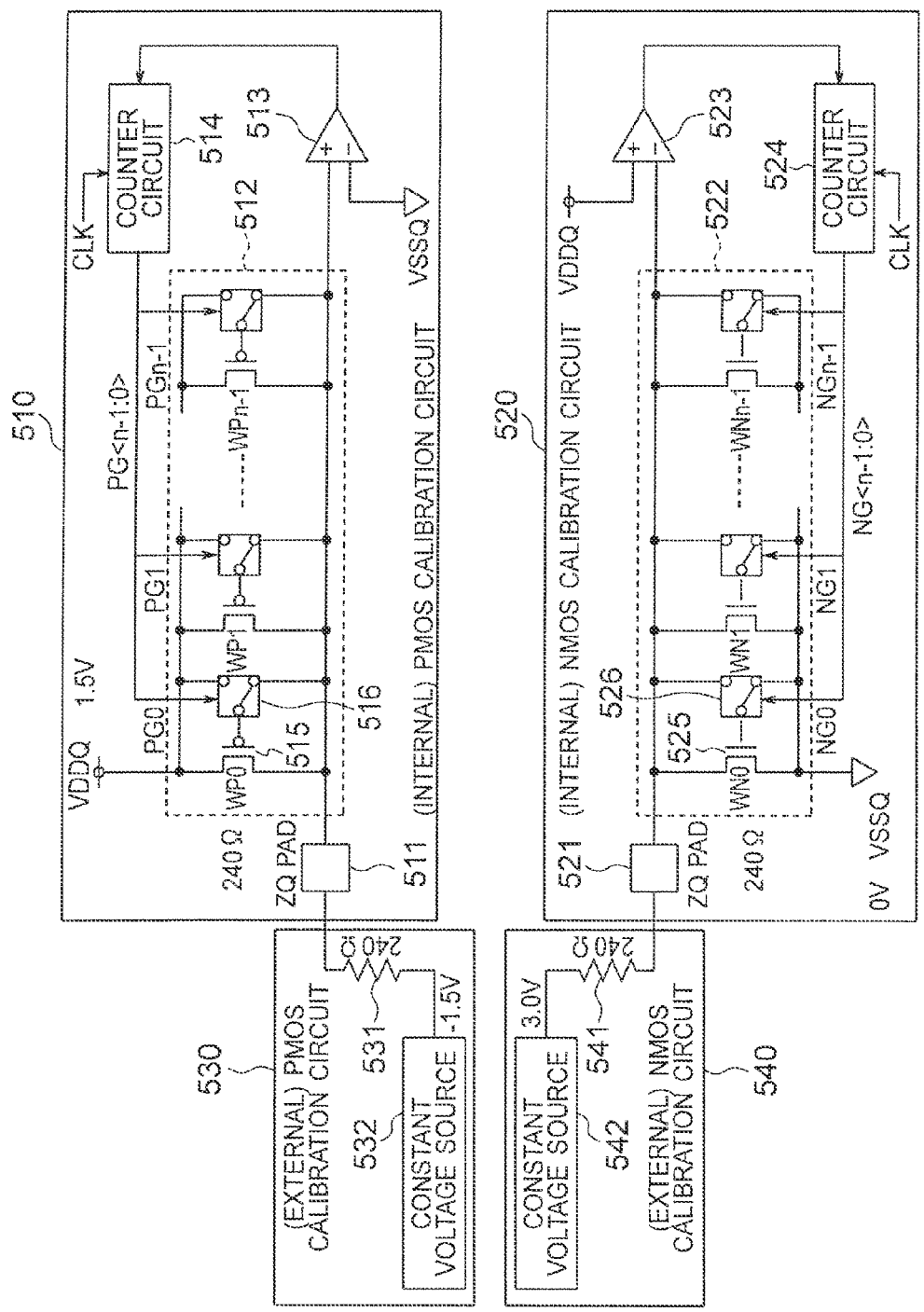
FIG. 5 is a diagram explanatory of a calibration circuit in a related semiconductor device.

A calibration operation is performed to adjust the impedance of the output circuits 222 included in the DQ input/output circuit 214 and the DQS input/output circuit 216. For example, as shown in FIG. 5, the ZQ test circuit of the related semiconductor device includes an internal PMOS calibration circuit 510 and an infernal NMOS calibration circuit 520.

The PMOS calibration circuit 510 has a (pull-up) replica circuit 512 connected between a first power source voltage (higher-potential power source voltage VDDQ in this example; e.g., 1.5 V) and a ZQ pad 511, a comparator circuit 513 operable to compare a voltage of the ZQ pad 511 with a second power source voltage (lower-potential power source voltage VSSQ in this example; e.g., 0 V), and a counter circuit (control circuit) 514 operable to control the impedance of the replica circuit 512 in accordance with an output of the comparator circuit 513.

The ZQ pad 511 is connected to art external terminal, which corresponds to the ZQ terminal 218 of FIG. 1. When a calibration operation is performed, an external PMOS calibration circuit 530 is connected to that external terminal. The external PMOS calibration circuit 530 has an external resistor 531 having a predetermined resistance value (e.g., 240Ω±1%) and a constant voltage source 532 connected to an end of the external resistor 531 for generating a constant voltage. The external PMOS calibration circuit 530 is a tool used during shipment inspection by a vendor who has manufactured the semiconductor device. It should be noted that the external PMOS calibration circuit 530 is an unnecessary (absent) part at the time when the semiconductor device has been shipped and mounted on a system.

The constant voltage to be generated by the constant voltage source 532 is determined such that the voltage of the ZQ pad 511 becomes 0 V when the impedance (on-resistance), of the replica circuit 512 is equal to the resistance value of the external resistor 531. Those conditions are the same voltage conditions at a read-out operation (high output) in which the output circuit (output transistor) of the data, signal (DQ) input/output circuit 214 externally outputs internal data. The internal data mean a transition from a low level to a high level. Therefore, the constant voltage generated by the constant voltage source 532 has the same absolute value as the power source voltage VDDQ but has a polarity opposite to that of the power source voltage VDDQ. If the power source voltage VDDQ is 1.5 V the constant voltage generated by the constant voltage source 532 is −1.5 V. In other words, voltage conditions between source terminals and drain terminals of a plurality of transistors (515) in the replica circuit 512 are the same as voltage conditions between a source terminal and a drain terminal of a first transistor connected to the first external terminal (DQi) and included in the output circuit of the data signal (DQ) input/output circuit 214 that outputs high-level data. That voltage is a difference voltage between a first voltage corresponding to high-level data outputted from the output transistor and a second voltage corresponding to low-level data.

The replica circuit 512 has the same configuration as a pull-up circuit (pull-up output driver) of the output circuit included in each of the DQ input/output circuit 214 and the DQS input/output circuit 215. Specifically, the replica circuit 512 has n PMOS transistors 515 connected in parallel between the first power source voltage (VDDQ) and the ZQ pad 511 and changeover switches 518 connected to gates of those PMOS transistors 515 where n is an integer not less than 2, for example n is 32.

Each of the changeover switches 516 is operable to supply the first power source voltage (VDDQ) or the voltage of the ZQ pad 511 to the gate of the corresponding PMOS transistor 515 depending upon an output (control signal PG) of the counter circuit 514. As shown in FIG. 5, when the first power source voltage (VDDQ) is supplied to the gate of the PMOS transistor 515 in a state in which the external PMOS calibration circuit 530 has been connected to the internal PMOS calibration circuit 510, then the PMOS transistor 515 is brought into an off-state. When the voltage of the ZQ pad 511 is supplied to the gate of the PMOS transistor 515 in that state, then the PMOS transistor 515 is brought into an on-state. The number of PMOS transistors 515 in an on-state determines the impedance (on-resistance) of the replica circuit 512.

The comparator circuit 513 compares the second power source voltage (VSSQ) with the voltage developed at the ZQ pad 511 and outputs the comparison result (a high level or a low level) to the counter circuit 514.

The counter circuit 514 performs a counting operation in accordance with a clock (ICLK) while the output of the comparator circuit 513 is at a high level. The count value of the counter circuit 514 is transmitted as the control signal PPG to each of the changeover switches 516 for controlling those changeover switches 516. The changeover switches 516 are controlled such that the number of PMOS transistors 515 in an on-state decreases as the count value of the counter circuit 514 increases. When the number of PMOS transistors 515 in an on-state decreases, the impedance of the replica circuit 512 increases so that the voltage developed at the ZQ pad 511 is lowered. Accordingly, if the voltage of the ZQ pad 511 becomes equal to or lower than the second power source voltage (VSSQ), then the output of the comparator circuit 513 changes into a low level, so that the counter circuit 514 stops the counting operation. The count value of the counter circuit 514 that has stopped the counting operation is stored as calibration information (impedance control information) in a storage portion of the ZQ adjustment circuit (corresponding to 217 of FIG. 2) and is utilized to set and adjust the impedance of the pull-up circuit of the output circuit. The setting and adjustment of the impedance of the pull-up circuit in the output circuit is conducted by for example, setting and adjusting the number of transistors being activated in the pull-up circuit.

Meanwhile, the NMOS calibration circuit 520 has a (pull-down) replica circuit 522 connected between a first power source voltage (lower-potential power source voltage VSSQ in this example; e.g., 0 V) and a ZQ pad 521, a comparator circuit 523 operable to compare a voltage of the ZQ pad 521 with a second power source voltage (higher-potential power source voltage VDDQ; e.g., 1.5 V), and a counter circuit (control circuit) 524 operable to control the impedance of the replica circuit 522 in accordance with an output of the comparator circuit 523.

The ZQ pad 521 is connected to another external terminal (not shown), which is different from the external terminal connected to the ZQ pad 511. When a calibration operation (a first calibration mode) is performed, an external NMOS calibration circuit 540 is connected to that external terminal. The ZQ pad 511 may be used as the ZQ pad 521. Alternatively, the ZQ pad 521 may be connected to the external terminal connected to the ZQ pad 511, which corresponds to the ZQ terminal 218 of FIG. 1. In such a case, the external PMOS calibration circuit 530 and the external NMOS calibration circuit 540 are switched in connection by a switching control (not shown) when a calibration operation is performed. Alternatively, a selected one of the constant voltage source 532 and a constant voltage source 542 may be connected to the external resistor 531 in a switched manner.

The external NMOS calibration circuit 540 is also a tool used during shipment inspection by a vendor who has manufactured the semiconductor device as with the external PMOS calibration circuit 530. It should be noted that the external NMOS calibration circuit 540 is an unnecessary (absent) part at the time when the semiconductor device has been shipped and mounted on a system.

The external NMOS calibration circuit 540 has an external resistor 541 having a predetermined resistance value (e.g., 240Ω±1%) and a constant voltage source 542 connected to an end of the external resistor 541 for generating a constant voltage.

The constant voltage to be generated by the constant voltage source 542 is determined such that the voltage of the ZQ pad 521 becomes 0 V when the impedance (on-resistance) of the replica circuit 522 is equal to the resistance value of the external resistor 541. Those conditions are the same voltage conditions at a read-out operation (low output) in which the output circuit (output transistor) of the data signal (DQ) input/output circuit 214 externally outputs internal data. The internal data mean a transition from a high level to a low level. Therefore, the constant voltage generated by the constant voltage source 542 is set to be twice the power source voltage VDDQ. When the power source voltage VDDQ is 1.5 V, the constant voltage generated by the constant voltage source 542 is 3.0 V. Therefore, voltage conditions between source terminals and drain terminals of a plurality of transistors (524) in the replica circuit 522 are the same as voltage conditions between a source terminal and a drain terminal of a first transistor connected to the first external terminal (DQi) and included in the output circuit of the data signal (DQ) input/output circuit 214 that outputs low-level data. That voltage is a difference voltage between a first voltage corresponding to high-level data outputted from the output transistor and a second voltage corresponding to low-level data.

The replica circuit 522 has the same configuration as a pull-down circuit (pull-down output driver) of the output circuit included in each of the DQ input/output circuit 214 and the DQS input/output circuit 215. Specifically, the replica circuit 522 has n NMOS transistors 525 connected in parallel between the first power source voltage (VSSQ) and the ZQ pad 521 and changeover switches 526 connected to gates of those NMOS transistors 525 where n is an integer not less than 2, for example n is 32.

Each of the changeover switches 526 is operable to supply the first power source voltage (VSSQ) or the voltage of the ZQ pad 511 to the gate of the corresponding NMOS transistor 525 depending upon an output (control signal NG) of the counter circuit 524. As shown in FIG. 5, when the first power source voltage (VSSQ) is supplied to the gate of the NMOS transistor 525 in a state in which the external NMOS calibration circuit 540 has been connected to the internal NMOS calibration circuit 520, then the NMOS transistor 525 is brought into an off-state. When the voltage of the ZQ pad 521 is supplied to the gate of the NMOS transistor 525 in that state, then the NMOS transistor 525 is brought into an on-state. The number of NMOS transistor 525 in an on-state determines the impedance of the replica circuit 522.

The comparator circuit 523 compares the second power source voltage (VDDQ) with the voltage developed at the ZQ pad 521 and outputs the comparison result (a high level or a low level) to the counter circuit 524.

The counter circuit 524 performs a counting operation in accordance with a clock (ICLK) while the output of the comparator circuit 523 is at a high level. The count value of the counter circuit 524 is transmitted as the control signal NG to each of the changeover switches 526 for controlling those changeover switches 526. The changeover switches 526 are controlled such that the number of NMOS transistors 525 in an on-state decreases as the count value of the counter circuit 524 increases. When the number of NMOS transistors 525 in an on-state decreases, the impedance of the replica circuit 522 decreases so that the voltage developed at the ZQ pad 521 is increased. Accordingly, if the voltage of the ZQ pad 521 exceeds the second power source voltage (VDDQ), then the output of the comparator circuit 523 changes info a low level, so that the counter circuit 524 stops the counting operation. The count value of the counter circuit 524 that has stopped the counting operation is stored as calibration information in a storage portion of the ZQ adjustment circuit (corresponding to 217 of FIG. 2) and is utilized to set and adjust the impedance of the pull-down circuit of the output circuit. The setting and adjustment of the impedance of the pull-down circuit of the output circuit is conducted by, for example, setting and adjusting the number of transistors being activated in the pull-down circuit.

Thus, the related semiconductor device is configured so that a calibration operation is performed in each of semiconductor chips.

However, if such semiconductor chips are stacked on a control chip as shown in FIG. 3 or 4, the impedance value indicated by calibration information obtained in each of the semiconductor chips varies depending upon the stacked location of the semiconductor chip, i.e., the wiring length between the semiconductor chip and the logical LSI chip 310. In other words, a semiconductor chip has a higher impedance as it is located farther from the logical LSI chip 310. This is because it seems to each of the semiconductor chips that the resistance value of the external resistance element used for a calibration operation increases by the parasitic resistance value of the through electrodes as the external terminal is provided on the logical LSI chip 310. Even if a calibration operation is conducted on each single one of the semiconductor chips, if seems to the logical LSI chip on which the semiconductor chips have been stacked that the parasitic resistance of the through electrodes is added to the impedance of the output circuit of each of the semiconductor chips. Thus, it seems that a semiconductor chip located farther from the logical LSI chip has a higher impedance.

In a semiconductor device according to the present embodiment, therefore, the counters and the comparator circuits included in the internal calibration circuits of the related semiconductor device are provided in the logical LSI chip 310. A semiconductor device according to the present embodiment will be described below in detail with reference to FIG. 6.

Figure 6:
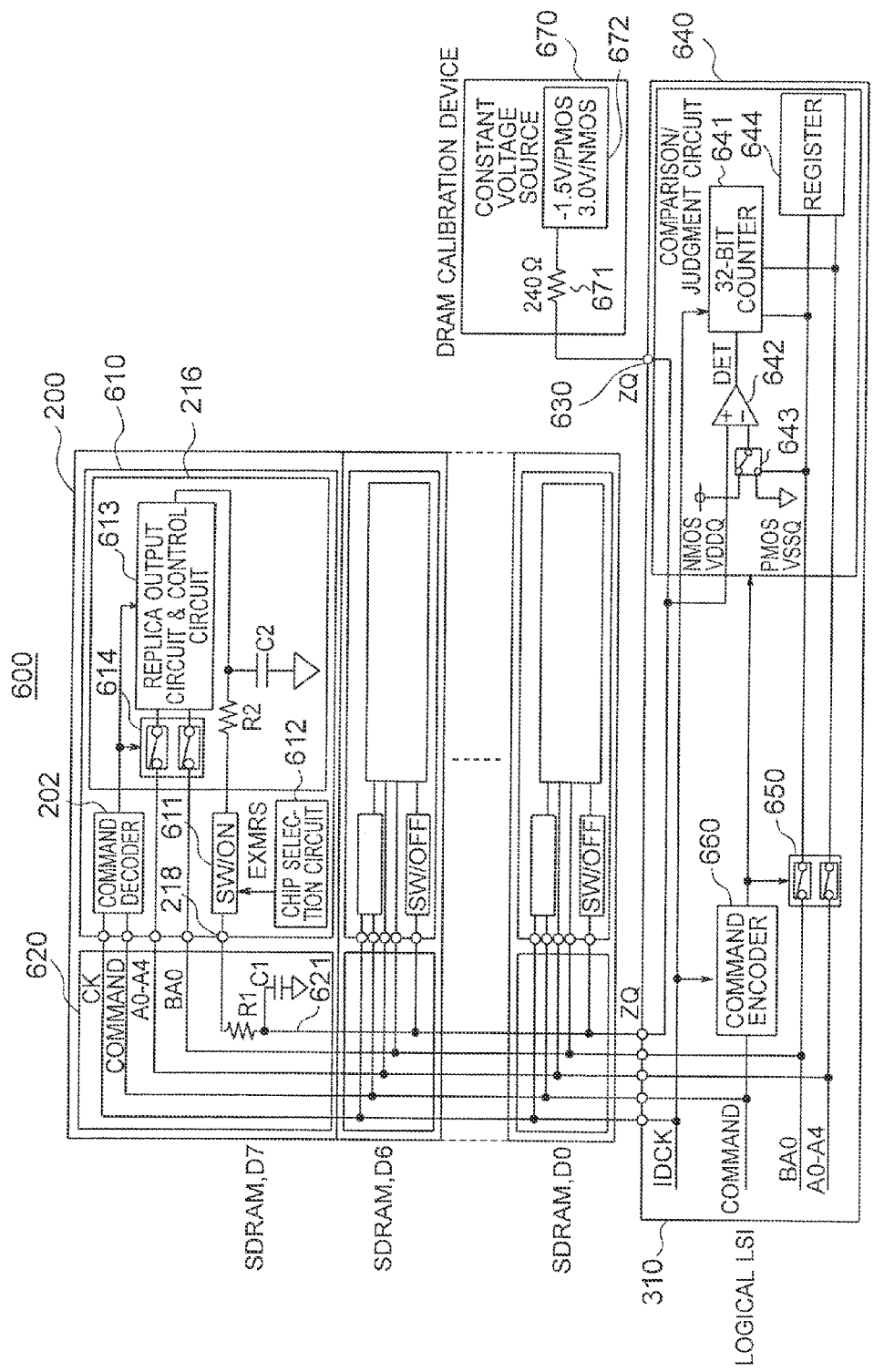
FIG. 6 is a diagram explanatory of a primary portion of the semiconductor device according to the first embodiment of the present invention.

FIG. 6 shows a semiconductor device 600 having a logical LSI chip 310 and eight semiconductor chips 200 (first to eighth semiconductor chips D0-D7) stacked on the logical LSI chip 310. Each of the semiconductor chips 200 has the configuration as described with reference to FIG. 2. FIG. 6 illustrates a portion of the internal configuration of the semiconductor device 600 that particularly relates to the present invention. FIG. 6 also illustrates a portion of the internal configuration of the logical LSI chip 310 that particularly relates to the present invention.

Each of the semiconductor chips 200 includes an internal circuit 610 and a through electrode circuit 620 having a plurality of through electrodes (TSVs) formed therein. The through electrodes are connected to a plurality of external terminals of the internal circuit 610. The through electrodes (first through electrodes) 621 in each of the chips 200 are respectively associated with through electrodes (second through electrodes) in other chips. The corresponding through electrodes are connected in a direction of stacking the chips 200. Each of the chips is connected to the logical LSI chip by its through electrodes and the through electrodes of the lower chips.

Each of the through electrodes 621 has a parasitic resistance and a parasitic capacity. FIG. 6 illustrates a parasitic resistance R1 and a parasitic capacity C1 for one of the through electrodes 621.

The internal circuit 610 includes a command decoder 202, a ZQ test circuit 216, a chip selection switch 611) and a chip selection circuit 612. The chip selection switch (first or second chip selection switch) 611 is connected between the ZQ test circuit 216 and a ZQ terminal (first or third ZQ terminal) 218. The ZQ terminal 218 is one of external terminals of the internal circuit 610. The ZQ terminal 218 is connected to the corresponding through electrode (first or second through electrode) 621. For example, the chip selection circuit 612 is configured as shown in FIG. 7.

Figure 7:
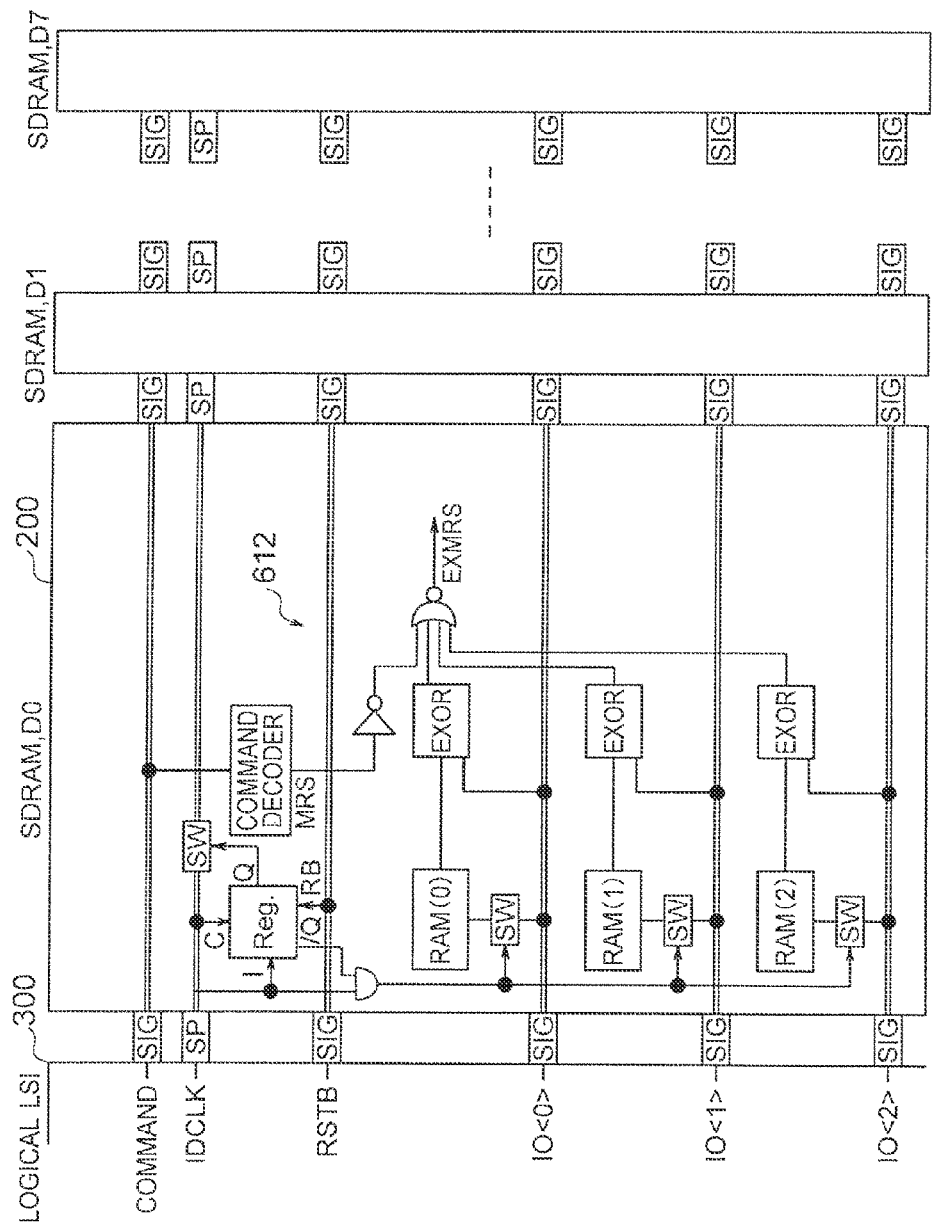
FIG. 7 is a diagram explanatory of a chip selection circuit included in the semiconductor device of FIG. 6.

The chip selection circuit 612 illustrated in FIG. 7 has a storage portion (RAM(0) to RAM(2)), in which identification information specific to each of the semiconductor chips 200 is stored. If information indicated by chip select signals IO<0> to IO<2> from the logical LSI chip 310 matches the specific identification information stored in the storage portion when a certain command MRS (mode register set) is inputted, then the chip selection circuit 612 outputs a control signal EXMRS (extended mode register set) for controlling the chip selection switch 611 so that the chip selection switch 611 is brought into conduction.

For example, as shown in FIG. 3, when the command MRS and the chip select signals IO<0> to IO<2> are supplied in common to the eight semiconductor chips D0-D7, each of the semiconductor chips D0-D7 outputs a control signal EXMRS (pulse) in turn. Thus, each of the ZQ test circuits 216 of the eight semiconductor chips D0-D7 is connected to the logical LSI chip 310 in turn.

Referring to FIG. 6, the ZQ test circuit 216 has a replica output circuit and control circuit 613, and a calibration mode switch 614. The replica output circuit and control circuit 613 correspond to the first replica circuit and the first control circuit or the second replica circuit and the second control circuit. The wiring of the ZQ test circuit 216 also has a parasitic resistance R2 and a parasitic capacity C2. The calibration mode switch 614 is brought into conduction upon entry of a calibration mode and brought out of conduction upon exit of the calibration mode.

Figure 9:
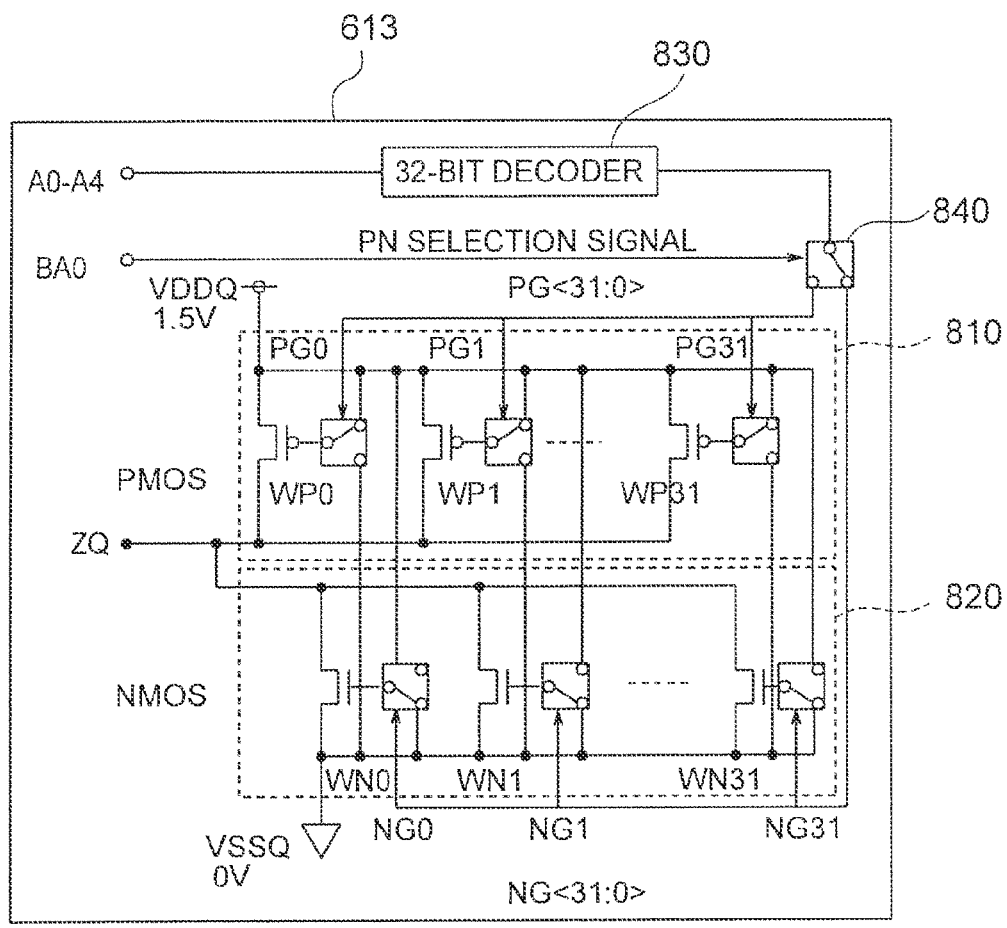
FIG. 9 is a diagram explanatory of an internal configuration of a replica output circuit and a control circuit included in the semiconductor device of FIG. 6.

The replica output circuit and control circuit 613 is configured as shown in FIG. 9. Specifically, the replica output circuit and control circuit 613 have a pull-up replica circuit 810, a pull-down replica circuit 820, a 32-bit decoder 830, and a changeover switch 840. The pull-up replica circuit 810 and the pull-down replica circuit 820 correspond to the replica circuits 512 and 522 of FIG. 5, respectively. Those replica circuits 810 and 820 are both connected to the ZQ terminal 218 via the chip selection switch 611. Meanwhile, the 32-bit decoder 830 and the changeover switch 840 serve as a control circuit (first control circuit) for controlling the replica circuits 810 and 820.

Referring to FIG. 6, the logical LSI chip 310 includes a second ZQ terminal 630 connected to the through electrode 621, which is connected to the first ZQ terminal 218. As those terminals can be regarded as being identical, they may be referred to as the second ZQ terminal 630.

The logical LSI chip 310 has a comparison/judgment circuit 640 connected to the second ZQ terminal 630. The logical LSI chip 310 also has a calibration mode switch 650 and a command encoder 660 for controlling the calibration mode switch 650.

The comparison/judgment circuit 640 includes a 32-bit counter 641, a comparator circuit 642, a changeover switch 643, and a register 644. The 32-bit counter 641 and the comparator circuit 642 correspond to the counter circuit 514 and the comparator circuit 513, or the counter circuit 524 and the comparator circuit 523 of FIG. 5, respectively. The 32-bit counter 641 and the register 644 serve as a second control circuit for performing a predetermined process in accordance with an output of the comparator circuit 642.

The second ZQ terminal 630 is connected to a DRAM calibration device 670. The DRAM calibration device 670 has a resistance element 671 having a predetermined resistance value (e.g., 240Ω±1%) and a constant voltage source 672 for supplying a constant voltage. For example, the constant voltage source 672 selectively outputs one of −1.5 V and 3.0 V. Alternatively, the constant voltage source 672 may output a single voltage (VDDQ/2).

Figure 10:
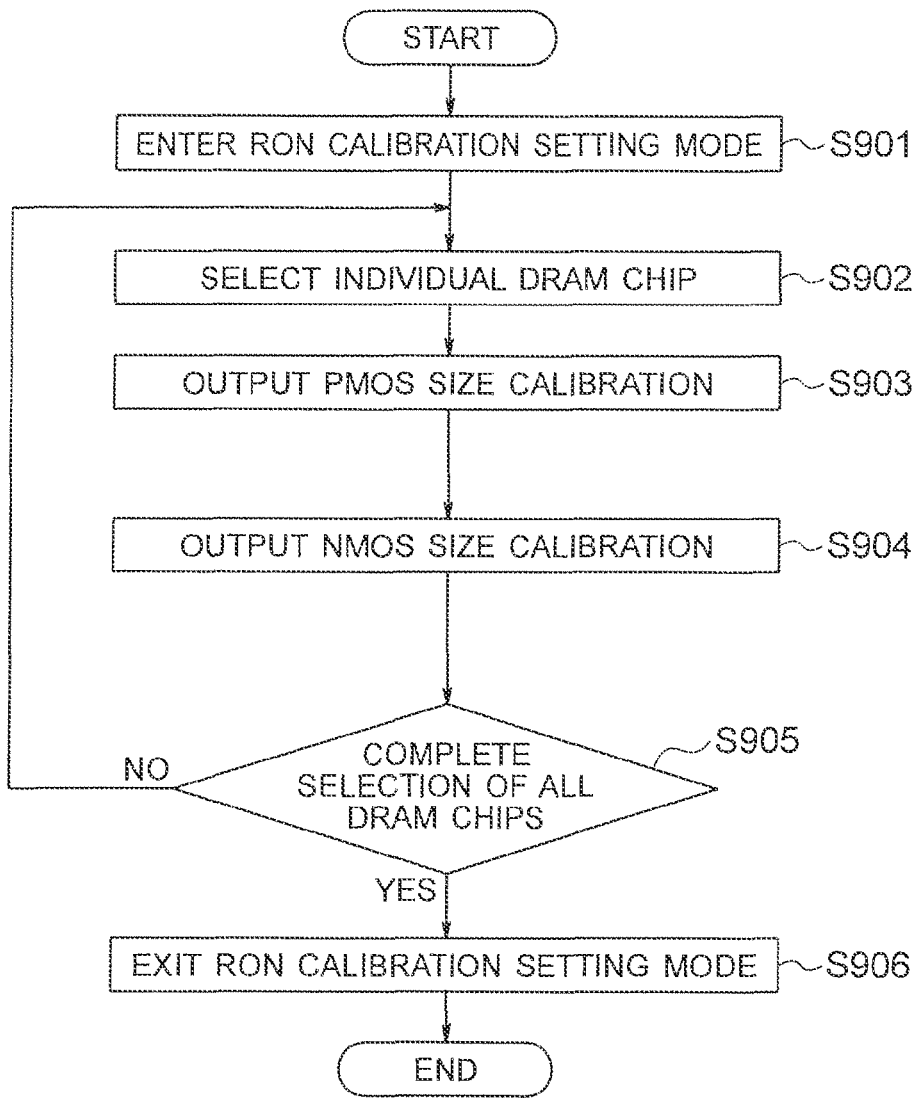
FIG. 10 is a flowchart explanatory of a calibration operation in the semiconductor device of FIG. 6.

Next, a calibration operation of the semiconductor device 600 shown in FIG. 6 will be described below. A calibration operation of the semiconductor device 600 is performed as shown in FIG. 10.

First, the process enters a RON calibration setting mode (Step S901).

Specifically, both of the calibration mode switches 614 and 650 are brought into conduction by a command to make an entry into a calibration mode. Thus, the address pins BA0 and A0-A4 of each of the semiconductor chips 200 are connected to the replica output circuit and control circuit 613. Furthermore, the address pins BA0 and A0-A4 of the logical LSI chip 310 are connected to the comparison/judgment circuit 640.

Next, one of the semiconductor chips 200 is selected (Step S902).

Figure 8:
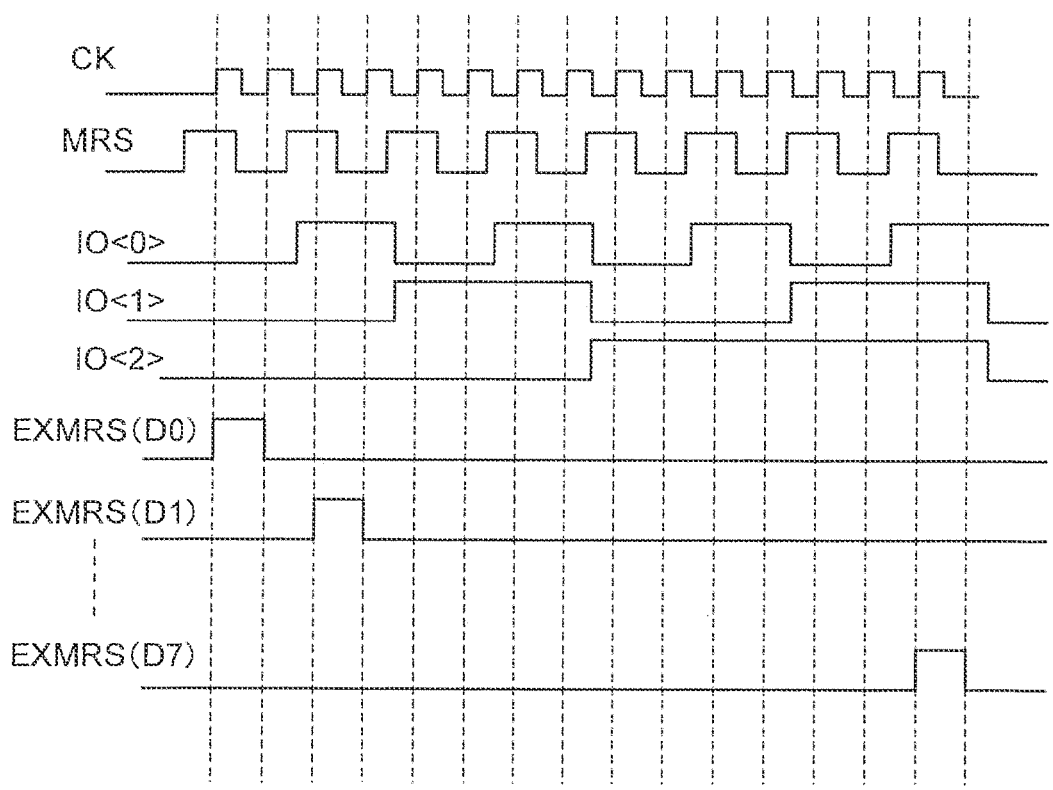
FIG. 8 is a waveform chart explanatory of an operation of the chip selection circuit of FIG. 7.

The selection of the semiconductor chips 200 is performed in a predetermined order. For example, one of the semiconductor chips 200 is selected from the lowermost semiconductor chip D0 to the uppermost semiconductor chip D7. FIG. 8 shows a state in which the uppermost semiconductor chip D7 has been selected. In the selected semiconductor chip 200, the chip selection switch 611 is brought into conduction (ON) so that the ZQ test circuit 216 is electrically connected to the ZQ terminal 218.

Then a calibration operation of the pull-up replica circuit 810 (FIG. 9) is performed in the selected semiconductor chip 200 (Step S903).

Specifically, for example, the bank address signal BA0 is set to be "0" (at a low level) to switch the changeover switch 643 into the lower-potential power source voltage VSSQ. Furthermore, the changeover switch 840 shown in FIG. 9 is switched into the pull-up replica circuit 810. At that time, an output voltage of the constant voltage source in the DRAM calibration device 670 is set to be −1.5 V.

Subsequently, the 32-bit counter 641 is operated, and the count value is supplied as the address signals A0-A4 to the selected semiconductor chip 200. The count value changes from <A4,A3,A2,A,A0>=<0,0,0,0,0> to <A4,A3,A2,A1,A0>=1, 1, 1, 1, 1> by the counting-up operation of the counter. The number of PMOS transistors being activated in the pull-up replica circuit 810 changes according to the count value of the 32-bit counter 641 in the same manner as described with reference to FIG. 5. Thus, the impedance of the pull-up replica circuit 810 changes. As a result, a voltage developed at the second ZQ terminal 630 changes. The voltage developed at the second ZQ terminal 630 is affected by a parasitic resistance of the through electrodes from the selected semiconductor chip 200 to the logical LSI chip 310. Therefore, the voltage developed at the second ZQ terminal 630 differs from a voltage developed at the first ZQ terminal 218.

The comparator circuit 642 compares the voltage developed at the second ZQ terminal 630 with a reference voltage (VSSG). If the voltage developed at the second ZQ terminal 630 becomes equal to or lower than the reference voltage, the comparator circuit 642 changes a detection signal DET from a "low" level to a "high" level to stop the 32-bit counter 641. The count value at the time when the 32-bit counter 641 has stopped is stored in the register 644 in association with the selected semiconductor chip 200.

Next, a calibration operation of the pull-down replica circuit 620 is performed in the selected semiconductor chip 200 (Step S904).

For example, the bank address signal BA0 is set to be '1' (at a high level) to switch the changeover switch 643 into the higher-potential power source voltage VDDQ. Furthermore, the changeover switch 840 shown in FIG. 9 is switched into the pull-down replica circuit 820. At that time, an output voltage of the constant voltage source in the DRAM calibration device 670 is set to be 3.0 V.

Subsequently, the 32-bit counter 641 is operated, and the count value is supplied as the address signals A0-A4 to the selected semiconductor chip 200. The number of NMOS transistors being activated in the pull-down replica circuit 820 changes according to the count value of the 32-bit counter 641, and the impedance of the pull-down replica circuit 820 changes. As a result, a voltage developed at the second ZQ terminal 630 changes. The comparator circuit 642 compares the voltage developed at the second ZQ terminal 630 with a reference voltage (VDDQ). If the voltage developed at the second ZQ terminal 630 becomes equal to or lower than the reference voltage, the comparator circuit 842 changes a detection signal DET from a "low" level to a "high" level to stop the 32-bit counter 641. The count value at the time when the 32-bit counter 641 has stopped is stored in the register 644 in association with the selected semiconductor chip 200.

Thus, the calibration operations of the pull-up replica circuit 810 and the pull-down replica circuit 820 are completed in the selected semiconductor chip 200. Then the logical LSI chip 310 determines whether or not calibration operations have been completed for ail of the semiconductor chips 200 (Step S905). If calibration operations have not been completed for all of the semiconductor chips 200 (NO), then the process returns to Step S902 so that a next semiconductor chip 200 is selected and subjected to the aforementioned calibration operations.

If calibration operations have been completed for ail of the semiconductor chips 200 (YES at Step S905), then the process exits from the RON calibration setting mode (Step S906). Specifically, both of the calibration mode switches 614 and 650 are brought out of conduction.

Figure 11:
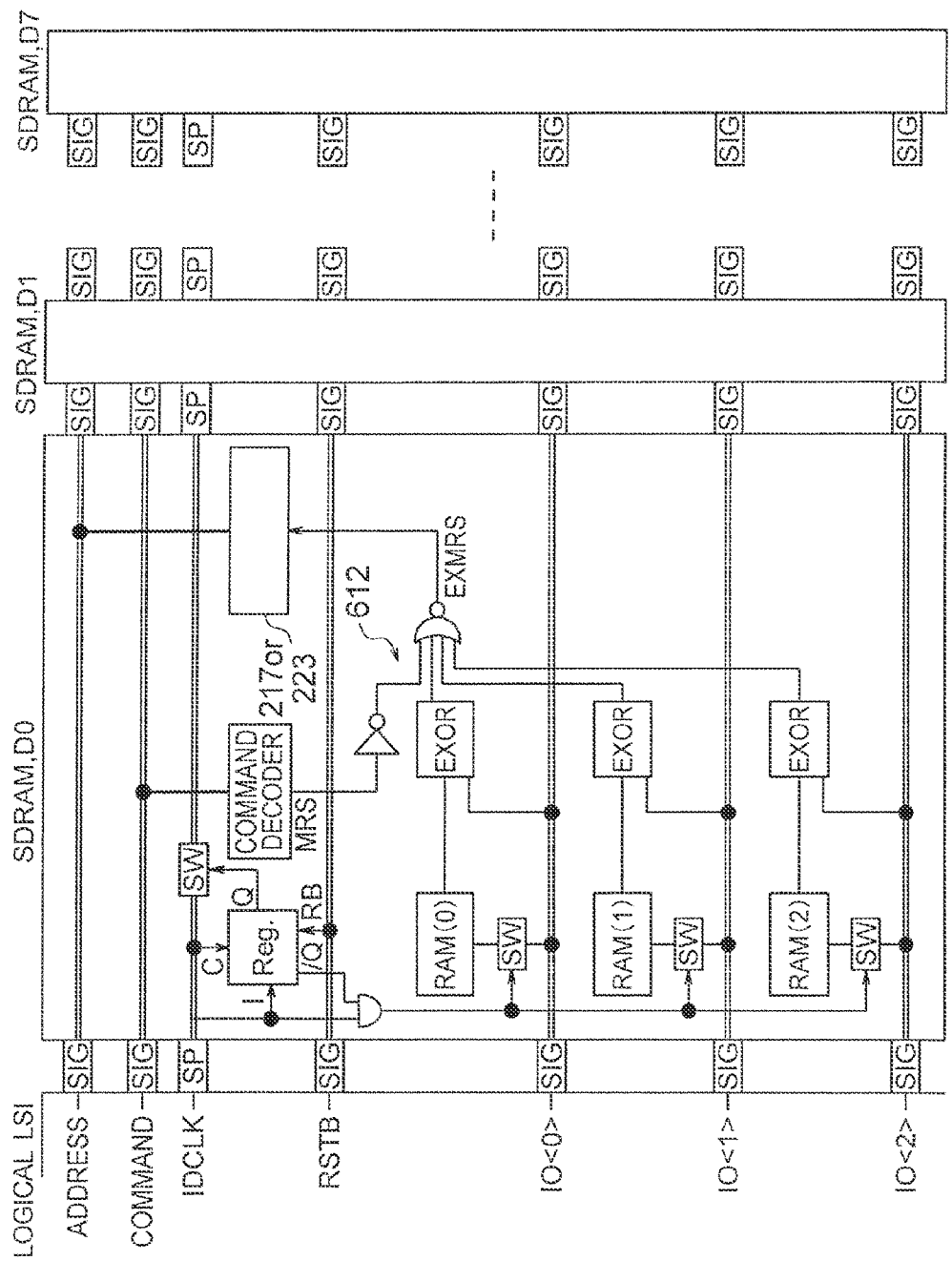
FIG. 11 is a diagram explanatory of transmission of a control code to an impedance adjustment circuit of each of semiconductor chips in the semiconductor device of FIG. 6.

The count value stored in the register 644 is then transmitted to the associated one of the semiconductor chips 200. As shown in FIG. 11, the chip selection circuit 612 outputs a control signal EXMRS, and the count value stored in the register 644 is supplied as address signals A0-A4 to each of the semiconductor chips 200. Thus, each of the semiconductor chips 200 stores, as a control code for controlling the impedance of the output circuit, the count value associated with that semiconductor chip 200 in the storage portion of the ZQ adjustment circuit 217. Alternatively, the ZQ adjustment circuit 217 may be omitted, and the count value may be stored in a storage portion of the impedance adjustment circuit 223 (FIG. 2). The ZQ adjustment circuit 217 transmits the control code stored in the storage portion to the impedance adjustment circuit 223 in accordance with a predetermined command input. The impedance adjustment circuit 223 adjusts the impedance of the output circuit based upon the control code stored in the storage portion.

Figure 12:
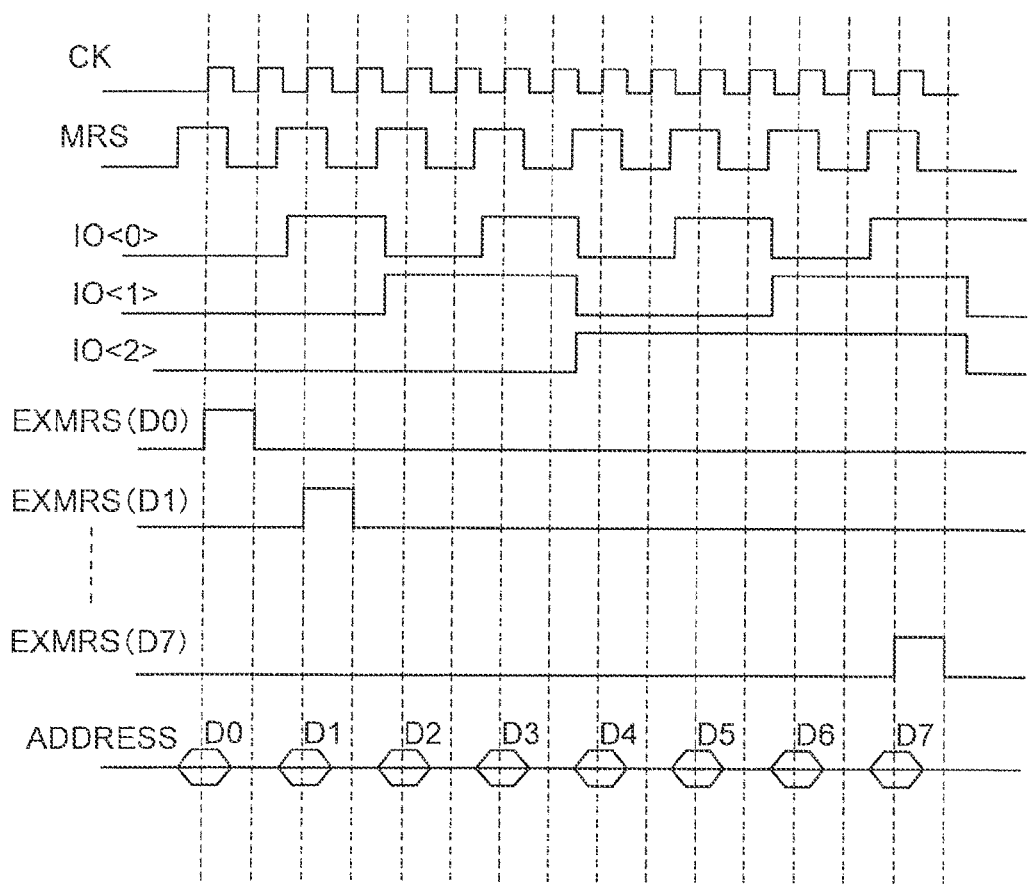
FIG. 12 is a waveform chart explanatory of transmission of a control code to the impedance adjustment circuits of all of the semiconductor chips in the semiconductor device of FIG. 6.

Transmissions of the control code from the register 644 to all of the semiconductor chips 200 can be performed in a continuous manner as shown in FIG. 12.

As described above, in the present embodiment, the comparator circuit 642 used for a calibration operation is provided in the logical LSI chip 310. A calibration operation of each of the semiconductor chips 200 is performed with use of the ZQ terminal 630 of the logical LSI chip 310. As a result, it seems to the logical LSI chip 310 that the output impedances of all of the semiconductor chips 200 are equal to each other irrespective of their stacked locations. Therefore, high-speed transmission of data can be achieved between each of the semiconductor chips 200 and the logical LSI chip 310.

In other words, in the present embodiment, a comparator circuit required for a calibration operation is separated from a first controlled chip including a first replica output circuit with respect to a second ZQ terminal of a control chip, to which an external resistance element is connected. Therefore, the calibrated impedance of the first replica output circuit ideally matches the value of the external resistance element. As a result, the output impedance of the first controlled chip as seen from the control chip can be matched with the resistance value of the external resistance element.

The ZQ adjustment circuit 217 has a function of detecting the temperature and includes a storage portion including a parameter table for storing the control code from the ZQ test circuit 216 in association with the detected temperature. The aforementioned calibration operations are performed a plurality of times while the ambient temperature is varied. Thus, control codes for different temperatures are obtained. The ZQ adjustment circuit 217 outputs the control code stored in the storage portion to the impedance adjustment circuit 223 in accordance with a command from the command decoder 202. If a control code is obtained for a single temperature, the ZQ adjustment circuit 217 may be omitted.

The aforementioned semiconductor device 600 can be used in various kinds of information processing systems.

For example, as shown in FIG. 13, the semiconductor device 600 is connected to a higher-level device 1200 by a command bus 1210, an address bus 1220, and a data bus 1230, so that an information processing system is formed.

Data outputted from each of the semiconductor chips 200 in the semiconductor device 600 are consumed by the logical LSI chip 310, or transmitted through the logical LSI chip 310 to the higher-level device 1200, or transmitted through an intermediate output buffer of the logical LSI chip 310 to the higher-level device 1200.

The semiconductor device 600 may also be used to form an information processing system as shown in FIG. 14.

The system of FIG. 14 includes a semiconductor device 600 and a higher-level device 1300. The semiconductor device 600 and the higher-level device 1300 are connected to each other by a command bus 1310, a data input/output (I/O) bus 1320, and an I/O replica bus 1330.

The higher-level device 1300 has a control signal generation circuit 1301 and a data processing circuit 1302.

The higher-level device 1300 is operable to control the semiconductor device 600. The higher-level device 1300 has interfaces with other circuit (not shown) in the system and circuits outside the system and is operable to control the entire system.

The data processing circuit 1302 of the higher-level device 1300 includes output circuits. In order to adjust the impedance (on-resistance) of those output circuits, the higher-level device 1300 has a ZQ test circuit 216 and a ZQ adjustment circuit 217 as with the semiconductor device 600.

The ZQ test circuit 216 of the higher-level device 1300 is connected to the semiconductor device 600 via a ZQ terminal and the I/O replica bus 1330. Thus, a ZQ calibration operation of the ZQ test circuit 216 in the higher-level device 1300 can also be performed with use of the DRAM calibration device 670 connected to the semiconductor device 600. Therefore, the output impedance of the higher-level device 1300 as seen from the logical LSI chip 310 of the semiconductor device 600 can be made equal to the output impedance of the semiconductor chips 200. Accordingly, a high-speed data transfer can be achieved between each of the semiconductor chips 200 and the higher-level device 1300.

The system as illustrated in FIG. 14 can be implemented with various electronic instruments such as personal computers, electronic communication devices, electronic products for transportations such as airplanes and automobiles, industry-oriented electronic products, and consumer-oriented electronic products. The ZQ test circuit 216 and the ZQ adjustment circuit 217 may be provided on all of the semiconductor devices of the system or on some of those semiconductor devices. When the ZQ test circuit 216 and the ZQ adjustment circuit 217 are provided on all of the semiconductor devices of the system. It is possible to reduce variations of the impedance (on-resistance) between the output circuits of the semiconductor devices and to thus achieve improvement in precision.

Although the present invention has been described with some embodiments, the present invention is not limited to the above embodiments. Many modifications and variations may be made therein without departing from the spirit and scope of the present invention.

The technical concept of the present invention is applicable to semiconductor devices having various functions. Furthermore, configurations of the circuits and structures of TSVs disclosed in the drawings are not limited to those illustrated in the above embodiments.

The technical concept of a semiconductor device according to the present invention can be applied to various semiconductor devices. For example, the present invention is generally applicable to semiconductor products such as a central processing unit (CPU), a micro control unit (MCU), a digital signal processor (DSP), an application specific integrated circuit (ASIC), an application specific standard product (ASSP), and a memory. For example, the present invention can be applied to semiconductor devices using package-on-package (POP) technology. Thus, the present invention can be applied to semiconductor devices in any product form or any package form.

Transistors used should be a field effect transistor (FET). However, various types of FETs including a metal oxide semiconductor (MOS), a metal-insulator semiconductor (MIS), and a thin film transistor (TFT) may be used for such transistors. Furthermore, the semiconductor device may include some bipolar transistors.

Furthermore, an N-type channel MOS transistor (NMOS transistor) is a typical example of a first conductive type of transistors, and a P-type channel transistor (PMOS transistor) is a typical example of a second conductive type of transistors.

The disclosed elements may be combined or selected in various ways within the scope of the appended claims of the present invention. In other words, the present invention includes a variety of changes and modifications that would be apparent to those skilled in the art from the entire disclosure and technical concept including the appended claims.

What is claimed is:

1. A method to calibrate an impedance of a device having a plurality of stacked semiconductor devices interconnected by through electrodes, the method comprising:
    coupling a resistor between an external terminal of the device and a first voltage source; and
    in each semiconductor device of the plurality of stacked semiconductor devices;
        enabling a replica output circuit having a first plurality of transistors connected between a second voltage source and a first through electrode coupled to the external terminal;
        adjusting a count value to control a number of transistors of the first plurality of transistors in an on-state until the count value reaches a final count value, wherein while the count value is at the final count value, a voltage on the external terminal is at a predetermined voltage;
        storing the final count value; and
        controlling an output circuit having a second plurality of transistors connected between the second, voltage source and a second through electrode using the final count value, wherein a number of transistors of the second plurality of transistors in the on-state is determined by the final count value.

2. The method of claim 1, wherein the plurality of stacked semiconductor devices comprises a control chip and the external terminal is on the control chip.

3. The method of claim 2, wherein the enabling of the replica output circuit is controlled by the control chip.

4. The method of claim 2, wherein the adjusting the count value is controlled by the control chip.

5. The method of claim 4, wherein the control chip comprises a comparator to determine when the voltage on the external terminal reaches the predetermined voltage.

6. The method of claim 4, wherein the control chip comprises a counter for adjusting the count value.

7. The method of claim 1, wherein the plurality of stacked semiconductor devices comprises memory chips.

8. The method of claim 1, wherein the plurality of stacked semiconductor devices comprises dynamic random access memory chips.

9. The method of claim 1, wherein the plurality of stacked semiconductor devices comprises synchronous dynamic random access memory chips.

10. The method of claim 1, wherein the first plurality of transistors and the second plurality of transistors are NMOS transistors.

11. The method of claim 10, wherein the second voltage source is substantially VSSQ and the first voltage source is a voltage higher than VSSQ.

12. The method of claim 1, wherein the first plurality of transistors and the second plurality of transistors are PMOS transistors.

13. The method of claim 12, wherein the second voltage source is VDDQ and the first voltage source is a voltage lower than VDDQ.

14. The method of claim 1, wherein the predetermined voltage is the midpoint voltage between the first voltage source and the second voltage source.

15. The method of claim 1, wherein the output circuit and the replica output circuit have the same configuration.

16. A method to calibrate an impedance of a device having a plurality of stacked semiconductor devices interconnected by through electrodes, the method comprising:
coupling a resistor between an external terminal of the device and a first voltage source; and
in each semiconductor device of the plurality of stacked semiconductor devices;
enabling a replica output circuit having a first plurality of PMOS transistors connected between a second voltage source and a first through electrode connected to the external terminal and a first plurality of NMOS transistors connected between a third voltage source and the first through electrode;
adjusting a PMOS count value to control a number of transistors of the first plurality of PMOS transistors in an on-state until the PMOS count value reaches a final PMOS count value, wherein while the PMOS count value is at the final PMOS count value, a voltage on the external terminal is at a first predetermined voltage;
storing the final PMOS count value;
adjusting an NMOS count value to control a number of transistors of the first plurality of NMOS transistors in the on-state until the NMOS count value reaches a final NMOS count value, wherein while the NMOS count value is at the final NMOS count value, the voltage on the external terminal is at a second predetermined voltage;
storing the final NMOS count value; and
controlling an output circuit having a second plurality of PMOS transistors connected between the second voltage source and a second through electrode and a second plurality of NMOS transistors connected between the third voltage source and the second through electrode using the final PMOS count value and the final NMOS count value, wherein a number of transistors of the second plurality of PMOS transistors in the on-state is determined by the final PMOS count value and the number of transistors of the second plurality of NMOS transistors in the on-state is determined by the final NMOS count value.

17. The method of claim 16, comprising changing a voltage of the first voltage source after adjusting the PMOS count value and before adjusting the NMOS count value.

18. The method of claim 16, comprising increasing a voltage of the first voltage source after adjusting the PMOS count value and before adjusting the NMOS count value.

19. The method of claim 16, wherein a voltage of the first voltage source is substantially equal to VSSQ while adjusting the PMOS count value and the voltage of the first voltage source is substantially equal to VDDQ while adjusting the NMOS count value.

20. The method of claim 16, wherein the plurality of stacked semiconductor devices comprises memory chips.

\* \* \* \* \*